(12) United States Patent
Mou et al.

(10) Patent No.: US 11,410,587 B2
(45) Date of Patent: Aug. 9, 2022

(54) SHIFT REGISTER UNIT AND METHOD FOR DRIVING SAME, GATE DRIVE CIRCUIT, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Guangying Mou, Beijing (CN); Jideng Zhou, Beijing (CN); Fengzhen Lv, Beijing (CN); Kaiwen Wang, Beijing (CN)

(73) Assignee: HEFEI XINSHENG OPTOELECTRONICS TECHNOLOGY CO., LTD, Hefei (CN)

( * ) Notice: Subject to any disclaimer, the term of this patent is extended or adjusted under 35 U.S.C. 154(b) by 125 days.

(21) Appl. No.: 16/937,656

(22) Filed: Jul. 24, 2020

(65) Prior Publication Data
US 2021/0056880 A1    Feb. 25, 2021

(30) Foreign Application Priority Data
Aug. 21, 2019    (CN) .......................... 201910775742.4

(51) Int. Cl.
*G09G 3/20*    (2006.01)
*G11C 19/28*    (2006.01)

(52) U.S. Cl.
CPC .............. *G09G 3/20* (2013.01); *G11C 19/28* (2013.01); *G09G 2310/0286* (2013.01)

(58) Field of Classification Search
CPC ........ G09G 3/36; G09G 3/20; G09G 2310/08; G09G 3/3426; G09G 2320/0233; G09G 2320/0626; G09G 3/3406; G09G 2320/0646; G09G 2360/16
See application file for complete search history.

(56) References Cited

U.S. PATENT DOCUMENTS

| 9,640,276 | B2* | 5/2017 | Li .......................... G11C 19/28 |
| 10,037,741 | B2* | 7/2018 | Wang .................... G09G 3/3688 |
| 10,997,886 | B2* | 5/2021 | Huang ...................... G09G 3/20 |
| 2011/0142192 | A1* | 6/2011 | Lin ......................... G11C 19/28 |
| | | | 377/77 |
| 2014/0086379 | A1* | 3/2014 | Ma ........................... H03K 5/00 |
| | | | 377/64 |
| 2014/0355732 | A1* | 12/2014 | Lin ........................ G06F 3/041 |
| | | | 377/64 |
| 2015/0325181 | A1* | 11/2015 | Wang ..................... G11C 19/28 |
| | | | 377/64 |

(Continued)

*Primary Examiner* — Olga V Merkoulova
(74) *Attorney, Agent, or Firm* — Fay Sharpe LLP

(57) ABSTRACT

Disclosed are a shift register unit and a method for driving the same, a gate drive circuit, and a display device. The pull-down control circuit in the shift register unit is capable of controlling a potential of a second pull-up node under control of the input signal provided by an input signal terminal. The pull-down circuit is capable of performing noise reduction on a first pull-up node and an output terminal under control of the second pull-up node. Since the potential of the second pull-up node is not pulled up due to the bootstrap effect, the threshold voltages of transistors in the pull-down circuit are less shifted, and the service life of the shift register unit is relatively long.

19 Claims, 8 Drawing Sheets

(56) References Cited

U.S. PATENT DOCUMENTS

| | | | |
|---|---|---|---|
| 2016/0268004 A1* | 9/2016 | Li | G09G 3/3648 |
| 2016/0307641 A1* | 10/2016 | Zheng | G09G 3/3677 |
| 2016/0358666 A1* | 12/2016 | Pang | G09G 3/3688 |
| 2017/0153742 A1* | 6/2017 | Pang | G06F 3/04166 |
| 2017/0178558 A1* | 6/2017 | Zhou | G09G 3/20 |
| 2017/0178584 A1* | 6/2017 | Ma | G09G 3/3696 |
| 2017/0186393 A1* | 6/2017 | Wang | G09G 3/36 |
| 2018/0336957 A1* | 11/2018 | Mi | G11C 19/287 |
| 2020/0219428 A1* | 7/2020 | Yuan | G09G 3/20 |

* cited by examiner

SHIFT REGISTER UNIT AND METHOD FOR DRIVING SAME, GATE DRIVE CIRCUIT, AND DISPLAY DEVICE The present disclosure claims priority to Chinese Patent Application No. 201910775742.4, filed with the National Intellectual Property Administration, PRC on Aug. 21, 2019 and entitled "SHIFT REGISTER UNIT AND METHOD FOR DRIVING SAME, GATE DRIVE CIRCUIT, AND DISPLAY DEVICE", the contents of which are herein incorporated by reference in their entireties.

TECHNICAL FIELD

The present disclosure relates to the field of display technology, and in particular, to a shift register unit and a method for driving the same, a gate drive circuit, and a display device.

BACKGROUND

The shift register usually includes multiple cascaded shift register units, and each shift register unit is configured to drive a row of pixel units. The multiple cascaded shift register units are capable of realizing progressive scan driving of each row of pixel units in a display device to display an image.

The shift register unit mainly includes: an input circuit, an output circuit, a pull-down control circuit and a pull-down circuit. The input circuit is capable of charging a pull-up node, and the output circuit is capable of outputting a drive signal to an output terminal under control of the pull-up node. The pull-down control circuit is capable of performing noise reduction on the pull-down node under control of the pull-up node, and the pull-down circuit is capable of performing noise reduction on the pull-up node and the output terminal under control of the pull-down node.

SUMMARY

The present disclosure provides a shift register unit and a method for driving the same, a gate drive circuit, and a display device. The technical solutions are as follows.

In one aspect, a shift register unit is provided. The shift register unit includes: an input circuit; an output circuit, a pull-down control circuit, and a pull-down circuit; wherein the input circuit is connected to an input signal terminal and a first pull-up node respectively, and the input circuit is configured to control a potential of the first pull-up node in response to an input signal provided by the input signal terminal;

the output circuit is connected to the first pull-up node, a clock signal terminal and an output terminal respectively, and the output circuit is configured to output a clock signal from the clock output terminal to the output terminal in response to the potential of the first pull-up node;

the pull-down control circuit is connected to the input signal terminal and a second pull-up node respectively, and the pull-down control circuit is configured to control a potential of the second pull-up node in response to the input signal; and the pull-down circuit is connected to a first power terminal, a second power terminal, the first pull-up node, the second pull-up node, and the output terminal respectively, and the pull-down circuit is configured to output a second power signal from the second power terminal to the first pull-up node and the output terminal respectively in response to the potential of the second pull-up node and a first power signal provided by the first power terminal.

Optionally, the pull-down control circuit includes: a pull-down control transistor;

wherein both a gate and a first electrode of the pull-down control transistor are connected to the input signal terminal, and a second electrode of the pull-down control transistor is connected to the second pull-up node.

Optionally, the pull-down circuit includes: a first control sub-circuit, a second control sub-circuit, and a pull-down sub-circuit; wherein a first control sub-circuit is connected to the first power terminal, a second power terminal, the pull-down control node and the second pull-up node respectively, and a first control sub-circuit is configured to output the first power signal to the pull-down control node in response to the first power signal, and output the second power signal to the pull-down control node in response to the potential of the second pull-up node;

the second control sub-circuit is connected to the first power terminal, the second power terminal, the pull-down control node, the pull-down node and the second pull-up node respectively, and the second control sub-circuit is configured to output the first power signal to the pull-down node in response to the potential of the pull-down control node, and output the second power signal to the pull-down node in response to the potential of the second pull-up node; and the pull-down sub-circuit is connected to the pull-down node, the first pull-up node, the output terminal and the second power terminal respectively, and the pull-down sub-circuit is configured to output the second power signal to the first pull-up node and the output terminal respectively in response to the potential of the pull-down node.

Optionally, the pull-down control circuit includes: two pull-down control transistors, and the second pull-up node includes: a first sub-pull-up node and a second sub-pull-up node; wherein both a gate and a first electrode of each pull-down control transistor are connected to the input signal terminal, wherein a second electrode of one of the pull-down control transistors is connected to the first sub-pull-up node, and a second electrode of the other pull-down control transistor is connected to the second sub-pull-up node; and the first control sub-circuit is connected to the first sub-pull-up node, and the second control sub-circuit is connected to the second sub-pull-up node.

Optionally, the first control sub-circuit includes: a first transistor and a second transistor, the second control sub-circuit includes: a third transistor and a fourth transistor, and the pull-down sub-circuit includes: a fifth transistor, a sixth transistor, and a seventh transistor; wherein both a gate and a first electrode of the first transistor are connected to the first power terminal, and a second electrode of the first transistor is connected to the pull-down control node; and a gate of the second transistor is connected to the second pull-up node, a first electrode of the second transistor is connected to the second power terminal, and a second electrode of the second transistor is connected to the pull-down control node.

a gate of the third transistor is connected to the pull-down control node, a first electrode of the third transistor is connected to the first power terminal, and a second electrode of the third transistor is connected to the pull-down node; and a gate of the fourth transistor is connected to the second pull-up node, a first electrode of the fourth transistor is connected to the second power terminal, and a second electrode of the fourth transistor is connected to the pull-down node.

gates of the fifth transistor, the sixth transistor, and the seventh transistor are all connected to the pull-down node, first electrodes of the fifth transistor, the sixth transistor, and the seventh transistor are all connected to the second power terminal, a second electrode of the fifth transistor is connected to the first pull-up node, and a second electrode of the sixth transistor and a second electrode of the seventh transistor are both connected to the output terminal.

Optionally, the shift register unit further includes a reset circuit; wherein the reset circuit is connected to a reset signal terminal, the second power terminal, the first pull-up node, and the second pull-up node respectively, and the reset circuit is configured to output the second power signal to the first pull-up node and the second pull-up node respectively in response to a reset signal provided by the reset signal terminal.

Optionally, the reset circuit includes: a first reset sub-circuit and a second reset sub-circuit; wherein the first reset sub-circuit is connected to the reset signal terminal, the second power terminal, and the first pull-up node respectively, and the first reset sub-circuit is configured to output the second power signal to the first pull-up node in response to the reset signal; and the second reset sub-circuit is connected to the reset signal terminal, the second power terminal, and the second pull-up node respectively, and the second reset sub-circuit is configured to output the second power signal to the second pull-up node in response to the reset signal.

Optionally, the first reset sub-circuit includes: a first reset transistor and the second reset sub-circuit includes: a second reset transistor; wherein a gate of the first reset transistor is connected to the reset signal terminal, a first electrode of the first reset transistor is connected to the second power terminal, and a second electrode of the first reset transistor is connected to the first pull-up node;

a gate of the second reset transistor is connected to the reset signal terminal, a first electrode of the second reset transistor is connected to the second power terminal, and a second electrode of the second reset transistor is connected to the second pull-up node.

Optionally, the second pull-up node includes: a first sub-pull-up node and a second sub-pull-up node, and the second reset sub-circuit includes: two second reset transistors;

wherein a gate of each second reset transistor is connected to the reset signal terminal, a first electrode of each second reset transistor is connected to the second power terminal, a second electrode of one of the second reset transistors is connected to the first sub-pull-up node, and a second electrode of the other second reset transistor is connected to the second sub-pull-up node.

Optionally, the output terminal includes: a first output terminal and a second output terminal; wherein the first output terminal is configured to connect a gate line, and the second output terminal is configured to connect the input signal terminal of a shift register unit at a next stage; and the output circuit is also connected to the second pull-up node, and the output circuit is configured to output the clock signal to the first output terminal in response to the potential of the first pull-up node, and output the clock signal to the second output terminal in response to the potential of the second pull-up node.

Optionally, the output circuit includes: a first output sub-circuit and a second output sub-circuit; wherein the first output sub-circuit is connected to the first pull-up node, the clock signal terminal and the first output terminal respectively, and the first output sub-circuit is configured to output the clock signal to the first output terminal in response to the potential of the first pull-up node; and the second output sub-circuit is connected to the second pull-up node, the clock signal terminal and the second output terminal respectively, and the second output sub-circuit is configured to output the clock signal to the second output terminal in response to the potential of the second pull-up node.

Optionally, the first output sub-circuit includes: a first output transistor and a capacitor, and the second output sub-circuit includes: a second output transistor; wherein a gate of the first output transistor is connected to the first pull-up node, a first electrode of the first output transistor is connected to the clock signal terminal, and a second electrode of the first output transistor is connected to the first output terminal;

one terminal of the capacitor is connected to the first pull-up node, and the other terminal of the capacitor is connected to the first output terminal; and a gate of the second output transistor is connected to the second pull-up node, a first electrode of the second output transistor is connected to the clock signal terminal, and a second electrode of the second output transistor is connected to the second output, terminal.

Optionally, the first power terminal includes a first sub-power terminal and a second sub-power terminal, the second power terminal includes a third sub-power terminal and a fourth sub-power terminal, and the output terminal includes: a first output terminal and a second output terminal;

the pull-down control circuit includes: a pull-down control transistor; wherein both a gate and a first electrode of the pull-down control transistor are connected to the input signal terminal, and a second electrode of the pull-down control transistor is connected to the second pull-up node;

the reset circuit includes: a first reset transistor and a second reset transistor; wherein gates of the first reset transistor and the second reset transistor are both connected to the reset signal terminal, first electrodes of the first reset transistor and the second reset transistor are both connected to the third sub-power terminal, a second electrode of the first reset transistor is connected to the first pull-up node, and a second electrode of the second reset transistor is connected to the second pull-up node;

the output circuit includes: a first output transistor, a second output transistor; and a capacitor; wherein a gate of the first output, transistor is connected to the first pull-up node, a first electrode of the first output transistor is connected to the clock signal terminal, a second electrode of the first output transistor is connected to the first output terminal, a gate of the second output transistor is connected to the second pull-up node, a first electrode of the second output transistor is connected to the clock signal terminal, the second electrode of the second output transistor is connected to the second output terminal, one terminal of the capacitor is connected to the first pull-up node; and the other terminal of the capacitor is connected to the first output terminal;

the input circuit includes: an input transistor; wherein both a gate and a first electrode of the input transistor are connected to the input signal terminal, and a second electrode of the input transistor is connected to the first pull-up node;

the pull-down circuit includes: two first transistors, two second transistors, two third transistors, two fourth transistors, two fifth transistors, two sixth transistors, and two seventh transistors; wherein a gate and a first electrode of one first transistor, and a first electrode of one third transistor are connected to the first sub-power terminal, and a gate and a first electrode of the other first transistor and a first electrode of the other third transistor are both connected to the second sub-power terminal; first electrodes of the two second transistors, first electrodes of the two fourth transistors, first electrodes of the two fifth transistors and first electrodes of the two seventh transistors are connected to the third sub-power terminal, and first electrodes of the two sixth transistors are both connected to the fourth sub-power terminal; and second electrodes of the two sixth transistors are both connected to the first output terminal, and second electrodes of the two seventh transistors are both connected to the second output terminal.

In another aspect, a method for driving a shift register unit is provided. The method is applicable to driving the shift register unit as mentioned above; and the method includes:

at an input stage where a potential of an input signal provided by the input signal terminal is a first potential, controlling, by the input circuit, the potential of the first pull-up node to be the first potential in response to the input signal, controlling, by the pull-down control circuit, the potential of the second pull-up node to be the first potential in response to the input signal, and prohibiting, by the pull-down circuit, the output of the second power signal from the second power terminal to the first pull-up node and the output terminal in response to the potential of the second pull-up node; and at an output stage where a potential of the first pull-up node is the first potential, outputting, by the output circuit, the clock signal from the clock signal terminal to the output terminal in response to the potential of the first pull-up node.

Optionally, the method further includes:

at a pull-down stage where a potential of the reset signal provided by the reset signal terminal is the first potential, outputting, by the reset circuit, a second power signal from the second power terminal to the second pull-up node in response to the reset signal, outputting, by the pull-down circuit, the second power signal to the first pull-up node and the output terminal respectively in response to the potential of the second pull-up node and the first power signal provided by the first power terminal, wherein the potential of the first power signal is the first potential, and the potential of the second power signal is a second potential.

In yet another aspect, a gate drive circuit is provided. The gate drive circuit includes: at least two cascaded shift register units mentioned as above.

In a still further aspect; a display device is provided. The display device includes: a plurality of pixel units, and the gate drive circuit mentioned as above connected to the plurality, of pixel units.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

Figure 1:
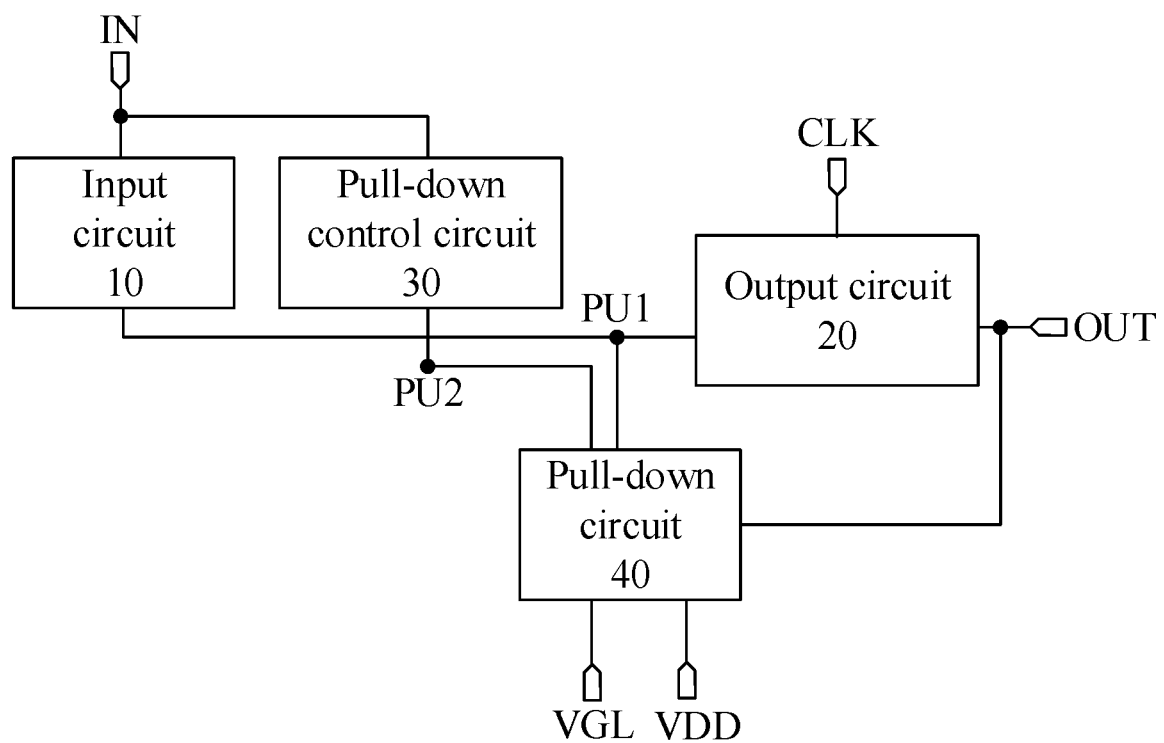
FIG. 1 is a schematic structural diagram of a shift register unit according to an embodiment of the present disclosure.

For clear descriptions of the objects, technical solutions and advantages in the present disclosure, the present disclosure is described in detail below in combination with the accompanying drawings.

Transistors used in all the embodiments of the present disclosure may be thin film transistors or field-effect transistors or other devices with the same characteristics. The transistors used in the embodiments of the present disclosure are mainly switching transistors according to the functions in the circuit. Since a source and a drain of the switching transistor used here are symmetrical, the source and the drain are interchangeable. In the embodiments of the present disclosure, the source is referred to as a first electrode and the drain is referred to as a second electrode, or the drain is referred to as a first electrode and the source is referred to as a second electrode. According to the form in the drawings, an intermediate terminal of the transistor is a gate, a signal input terminal is the source, and a signal output terminal is the drain. In addition, the switching transistors used in the embodiments of the present disclosure may include any one of a P-type switching transistor and an N-type switching transistor. The P-type switching transistor is turned on when the gate is at a low level and is turned off when the gate is at a high level, and the N-type switching transistor is turned on when the gate is at a high level and turned off when the gate is at a low level. In addition, a plurality of signals in various embodiments of the present disclosure each correspond to a first potential and a second potential. The first potential and the second potential only represent that the signal has potentials with two different state quantities, and do not represent that the first potential or the second potential has a specific value in the whole text.

For practice of a narrow-bezel display device under the premise of reducing the cost, the shift register unit is generally manufactured by using a gate driver on array (GOA) technology.

Currently, the shift register unit may include various architectures, for example a 19T1C (that is, 19 transistors and 1 capacitor) architecture. However, for the shift register units of various architectures, an input circuit is connected to only one pull-up node, an output circuit is capable of outputting a drive signal to an output terminal under control of the pull-up node, and a pull-down control circuit is capable of performing noise reduction on a pull-down node under control of the pull-up node. In addition, for the sake of output reliability of the output circuit, the capacitor in the output circuit is capable of pulling a potential of the pull-up node up during an output stage by a bootstrap effect. For example, in the output stage, the potential of the pull-up node may be pulled up from VGH to 2VGH under the bootstrap effect of the capacitor.

Since the pull-down control circuit performs noise reduction on the pull-down node under control of the pull-up node, during the output stage, when the potential of the pull-up node is pulled up, bias voltages of the gates of the transistors in the pull-down control circuit may be greater, and threshold voltages of the transistors are largely shifted. Moreover, as operating time of the shift register unit is prolonged, the threshold voltages of the transistors may be shifted more severely, resulting in a decrease in a charging capacity of the transistor and a problem of poor display of the display panel.

An embodiment of the present disclosure provides a shift register unit, which may solve the problem that the threshold voltage shift of the transistors included in the shift register unit in the related art is relatively severe.

FIG. 1 is a schematic structural diagram of a shift register unit according to an embodiment of the present disclosure. As shown in FIG. 1, the shift register unit may include: an input circuit 10, an output circuit 20, a pull-down control circuit 30, and a pull-down circuit 40.

The input circuit 10 may be connected to an input signal terminal IN and a first pull-up node PU1 respectively. The input circuit 10 may control a potential of the first pull-up node PU1 in response to an input signal provided by the input signal terminal IN.

Exemplarily, the input circuit 10 may output the input signal at the first potential to the first pull-up node PU1 when the potential of the input signal provided by the input signal terminal IN is a first potential. In the embodiment of the present disclosure, the first potential may be an active potential.

The output circuit 20 may be connected to the first pull-up node PU1, a clock signal terminal CLK, and an output terminal OUT respectively. The output circuit 20 may output a clock signal from the clock signal terminal CLK to the output terminal OUT in response to the potential of the first pull-up node PU1.

Exemplarily, the output circuit 20 may output the clock signal from the clock signal terminal CLK to the output terminal OUT when the potential of the first pull-up node PU1 is the first potential.

The pull-down control circuit 30 may be connected to the input signal terminal IN and a second pull-up node PU2 respectively. The pull-down control circuit 30 may control a potential of the second pull-up node PU2 in response to the input signal.

Exemplarily, the pull-down control circuit 30 may output the input signal at the first potential to the second pull-up node PU2 when the potential of the input signal is the first potential.

Optionally, the pull-down control circuit 30 may also be connected to a power terminal for providing a power signal of the first potential. Correspondingly, when the potential of the input signal is the first potential, the pull-down control circuit 30 may output the power signal of the first potential provided by the power terminal to the second pull-up node PU2.

The pull-down circuit 40 may be connected to a first power terminal VDD, a second power terminal VGL, the first pull-up node PU1, the second pull-up node PU2, and the output terminal OUT respectively. The pull-down circuit 40 may output a second power signal from the second power terminal VGL to the first pull-up node PU1 and the output terminal OUT respectively in response to the potential of the second pull-up node PU2 and the first power signal provided by the first power terminal VDD.

Exemplarily, the potential of the first power signal provided by the first power terminal VDD may be the first potential. The pull-down circuit 40 may output the second power signal from the second power terminal VGL to the first pull-up node PU1 and the output terminal OUT respectively under control of the potential of the second pull-down node PU2 and the first power signal when the potential of the second pull-down node PU2 is the second potential. The potential of the second power signal may be a second potential, and the second potential may be an inactive potential, such that noise reduction may be achieved for the first pull-up node PU1 and the output terminal OUT. Optionally, the second potential may be a low potential relative to the first potential.

Since the pull-down circuit 40 performs noise reduction on the first pull-up node PU1 and the output terminal OUT under control of the second pull-down node PU2, and since the pull-down control circuit 30 controls the second pull-down node PU2 under control of the input signal, the potential of the input signal (i.e., the potential of the second pull-up node PU2) will not be pulled up during the output stage due to the bootstrap effect of the capacitor in the output circuit 20. Therefore, the threshold voltage shift of the transistors in the pull-down circuit 40 may be reduced and the service life of the shift register unit is prolonged. In addition, the problem of insufficient charging after a long time use of the shift register unit may be improved, and the display effect of the display panel is ensured.

In summary, the embodiment of the present disclosure provides a shift register unit. The shift register unit includes the pull-down control circuit and the pull-down circuit. The pull-down control circuit is capable of controlling the potential of the second pull-up node under control of the input signal provided by the input signal terminal. The pull-down circuit is capable of performing noise reduction on the first pull-up node and the output terminal under control of the second pull-up node. Since the potential of the input signal, that is, the potential of the second pull-up node will not be pulled up due to the bootstrap effect, the threshold voltages of the transistors in the pull-down circuit may be shifted to a lesser degree, and the service life of the shift register unit is relatively long.

Figure 2:
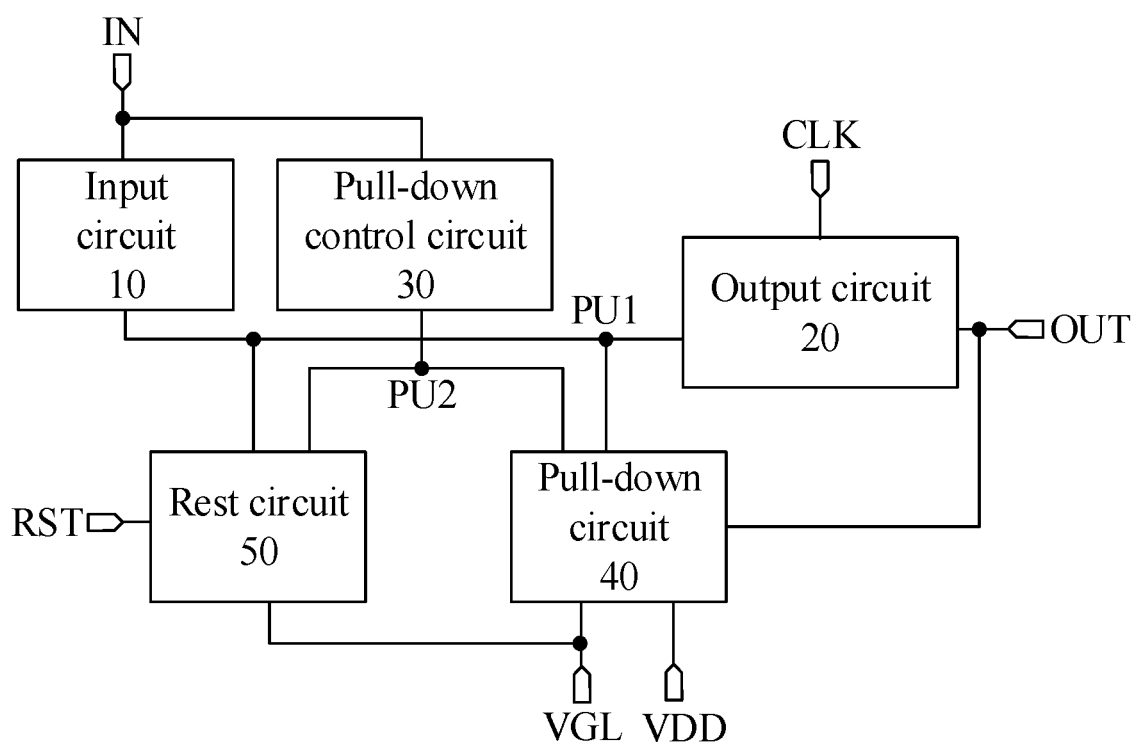
FIG. 2 is a schematic structural diagram of another shift register unit according to an embodiment of the present disclosure.

FIG. 2 is a schematic structural diagram of another shift register unit according to an embodiment of the present disclosure. As shown in FIG. 2, the shift register unit may further include a reset circuit 50.

The reset circuit 50 may be connected to a reset signal terminal RST, the second power terminal VGL, the first pull-up node PU1, and the second pull-up node PU2 respectively. The reset circuit 50 may output a second power signal to the first pull-up node PU1 and the second pull-up node PU2 respectively in response to the reset signal provided by the reset signal terminal RST.

Exemplarily, the reset circuit 50 may output the second power signal at the second potential to the first pull-up node PU1 and the second pull-up node PU2 respectively when the potential of the reset signal provided by the reset signal terminal RST is the first potential, thereby achieving noise reduction for the first pull-up node PU1 and the second pull-up node PU2.

By using the reset circuit 50 to perform noise reduction on the second pull-up node PU2, it may be ensured that after the output stage, the pull-down circuit 40 is capable of performing reliable noise reduction on the first pull-up node PU1 and the output terminal OUT under control of the first power signal provided by the first power terminal VDD.

Figure 3:
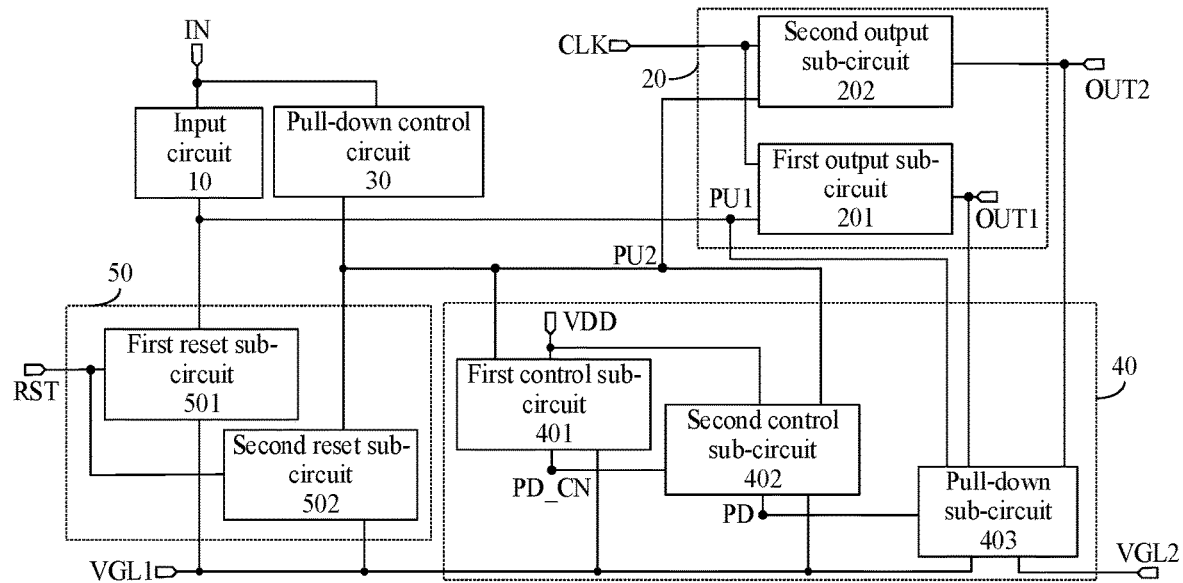
FIG. 3 is a schematic structural diagram of yet another shift register unit according to an embodiment of the present disclosure.

FIG. 3 is a schematic structural diagram of yet another shift register unit according to an embodiment of the present disclosure. As shown in FIG. 3, the pull-down circuit 40 may include: a first control sub-circuit 401, a second control sub-circuit 402, and a pull-down sub-circuit 403.

The first control sub-circuit 401 may be connected to the first power terminal VDD, the second power terminal VGL, a pull-down control node PD_CN and the second pull-up node PU2 respectively. The first control sub-circuit 401 may output the first power signal to the pull-down control node PD_CN in response to the first power signal, and may output the second power signal to the pull-down control node PD_CN in response to the potential of the second pull-up node PU2.

Exemplarily, the potential of the first power signal provided by the first power terminal VDD may be the first potential, and the first control sub-circuit 401 may output the first power signal at the first potential to the pull-down control node PD_CN under control of the first power signal, so as to charge the pull-down control node PD_CN. Moreover, when the potential of the second pull-up node PU2 is the first potential, the second power signal at the second potential may be output to the pull-down control node PD_CN to achieve noise reduction for the pull-down control node PD_CN.

The second control sub-circuit 402 may be connected to the first power terminal VDD, the second power terminal VGL, the pull-down control node PD_CN, the pull-down node PD, and the second pull-up node PU2 respectively. The second control sub-circuit 402 may output the first power signal to the pull-down node PD in response to the potential of the pull-down control node PD_CN, and may output the second power signal to the pull-down node PD in response to the potential of the second pull-up node PU2.

Exemplarily, the second control sub-circuit 402 may output the first power signal at the first potential to the pull-down node PD when the potential of the pull-down control node PD_CN is the first potential, so as to charge the pull-down node PD. When the potential of the second pull-up node PU2 is the first potential, the second power signal at the second potential may be output to the pull-down node PD to achieve noise reduction for the pull-down node PD.

The pull-down sub-circuit 403 may be connected to the pull-down node PD, the first pull-up node PU1, the output terminal OUT, and the second power terminal VGL respectively. The pull-down sub-circuit 403 may output the second power signal to the first pull-up node PU1 and the output terminal OUT respectively in response to the potential of the pull-down node PD.

Exemplarily, the pull-down sub-circuit 403 may output the second power signal at the second potential to the first pull-up node PU1 and the output terminal OUT respectively when the potential of the pull-down node PD is the first potential, thereby achieving noise reduction for the first pull-up node PU1 and the output terminal OUT.

Referring to FIG. 3, the output terminal OUT may include: a first output terminal OUT1 and a second output terminal OUT2. The first output terminal OUT1 may be configured to connect one or more gate lines in the display substrate. Correspondingly, the output signal output from the first output terminal OUT1 may be provided to the gate line connected thereto as a gate drive signal. The second output terminal OUT2 may be configured to connect the input signal terminal IN of a shift register unit at a next stage. Correspondingly, the output signal output from the second output terminal OUT2 may be provided to the shift register unit cascaded therewith as an input signal, thereby controlling the operation of the shift register unit cascaded therewith. The pull-down sub-circuit 403 may be connected to the first output terminal OUT1 and the second output terminal OUT2 respectively. The pull-down sub-circuit 403 may output the second power signal at the second potential to the first pull-up node PU1, the first output terminal OUT1, and the second output terminal OUT2 respectively when the potential of the pull-down node PD is the first potential, thereby achieving noise reduction for the first pull-up node PU1, the first output terminal OUT1, and the second output terminal OUT2.

In one implementation, referring to FIG. 3, the second power terminal VGL may include a third sub-power terminal VGL1 and a fourth sub-power terminal VGL2. A potential of a fourth sub-power signal provided by the fourth sub-power terminal VGL2 is less than a potential of the third sub-power signal provided by the third sub-power terminal VGL1.

Referring to FIG. 3, the first sub-control circuit 401 and the second sub-control circuit 402 may be both connected to the third sub-power terminal VGL1. The pull-down sub-circuit 403 may be connected to the third sub-power terminal VGL1 and the fourth sub-power terminal VGL2. The pull-down sub-circuit 403 may output the third sub-power signal to the first pull-up node PU1 and the second output terminal OUT2 when the potential of the pull-down node PD is the first potential, and output the fourth sub-power signal to the first output terminal OUT1. Since the potential of the fourth sub-power signal is lower than the potential of the third sub-power signal, reliable noise reduction may be achieved for the first output terminal OUT1.

Optionally, referring to FIG. 3, the reset circuit 50 may include: a first reset sub-circuit 501 and a second reset sub-circuit 502.

The first reset sub-circuit 501 may be connected to the reset signal terminal RST, the second power terminal VGL, and the first pull-up node PU1 respectively. The first reset sub-circuit 501 may output a second power signal to the first pull-up node PU1 in response to the reset signal.

Exemplarily, the first reset sub-circuit 501 may be connected to the third sub-power terminal VGL1, and the first reset sub-circuit 501 may output the third sub-power signal at the second potential to the first pull-up node PU1 when the potential of the reset signal provided by the reset signal terminal RST is the first potential, thereby achieving noise reduction for the first pull-up node PU1.

The second reset sub-circuit 502 may be connected to the reset signal terminal RST, the second power terminal VGL, and the second pull-up node PU2 respectively. The second reset sub-circuit 502 may output the second power signal to the second pull-up node PU2 in response to the reset signal.

Exemplarily, the second reset sub-circuit 502 may also be connected to the third sub-power terminal VGL1. The second reset sub-circuit 502 may output the third sub-power signal at the second potential to the second pull-up node PU2 when the potential of the reset signal is the first potential, thereby achieving noise reduction for the second pull-up node PU2.

By disposing two reset sub-circuits to perform noise reduction on the two pull-up nodes respectively, the reliability of noise reduction may be effectively ensured.

Optionally, referring to FIG. 3, the output circuit 20 may also be connected to the second pull-up node PU2. The output circuit 20 may output a clock signal to the first output terminal OUT1 in response to the potential of the first pull-up node PU1, and may output a clock signal to the second output terminal OUT2 in response to the potential of the second pull-up node PU2.

Exemplarily, referring to FIG. 3, the output circuit 20 may include: a first output sub-circuit 201 and a second output sub-circuit 202.

The first output sub-circuit 201 may be connected to the first pull-up node PU1, the clock signal terminal CLK, and the first output terminal OUT1 respectively. The first output sub-circuit 201 may output the clock signal to the first output terminal OUT1 in response to the potential of the first pull-up node PU1.

Exemplarily, the first output sub-circuit 201 may output the clock signal to the first output terminal OUT1 when the potential of the first pull-up node PU1 is the first potential, so as to charge the first pull-up node PU1.

The second output sub-circuit 202 may be connected to the second pull-up node PU2, the clock signal terminal CLK, and the second output terminal OUT2 respectively. The second output sub-circuit 202 may output the clock signal to the second output terminal OUT2 in response to the potential of the second pull-up node PU2.

Exemplarily, the second output sub-circuit 202 may output the clock signal to the second output terminal OUT2 when the potential of the second pull-up node PU2 is the first potential, so as to charge the second pull-up node PU2.

Optionally, in the embodiment of the present disclosure, the output circuit 20 may not be connected to the second pull-up node PU2, that is, the first output sub-circuit 201 and the second output sub-circuit 202 may be both connected to the first pull-up node PU1. Correspondingly, the second output sub-circuit 202 may also output a clock signal to the second output terminal OUT2 when the potential of the first pull-up node PU1 is the first potential.

Figure 4:
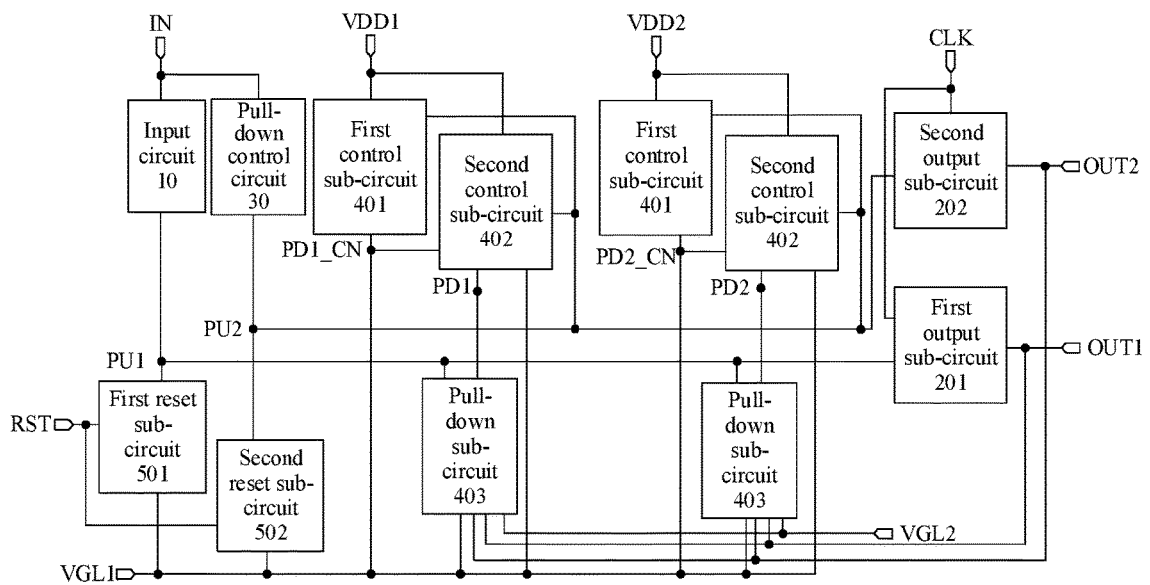
FIG. 4 is a schematic structural diagram of still a further shift register unit according to an embodiment of the present disclosure.

FIG. 4 is a schematic structural diagram of still a further shift register unit according to an embodiment of the present disclosure. As shown in FIG. 4, the shift register unit may include: two first control sub-circuits 401, two second control sub-circuits 402, two pull-down sub-circuits 403, two pull-down control nodes PD_CN, and two pull-down nodes PD.

The two first control sub-circuits 401 may be connected to different first power terminals VDD, and the two second control sub-circuits 402 may be connected to different first power terminals VDD.

Referring to FIG. 4, the first power terminal VDD may include a first sub-power terminal VDD1 and a second sub-power terminal VDD2. The potential of the first sub-power signal provided by the first sub-power terminal VDD1 and the potential of the second sub-power signal provided by the second sub-power terminal VDD2 may be complementary. That is, when the potential of the first sub-power signal is the first potential, the potential of the second sub-power signal is the second potential. When the potential of the first sub-power signal is the second potential, the potential of the second sub-power signal is the first potential.

Referring to FIG. 4, in the two first control sub-circuits 401, one of the first control sub-circuits 401 may be connected to the first sub-power terminal VDD1, one pull-down control node PD_CN (for example, the pull-down control node PD1_CN), the third sub-power terminal VGL1, and the second pull-up node PU2 respectively. The other first control sub-circuit 401 may be connected to the second sub-power terminal VDD2, the other pull-down control node PD_CN (for example, the pull-down control node PD2_CN), the third sub-power terminal VGL1, and the second pull-up node PU2 respectively.

In the two second control sub-circuits 402, one second control sub-circuit 402 may be connected to one pull-down control node PD_CN (for example, the pull-down control node PD_CN), the first sub-power terminal VDD1, one pull-down node PD (for example, the pull-down node PD1), the third sub-power terminal VGL1, and the second pull-up node PU2 respectively. The other second control sub-circuit 402 may be connected to the other pull-down control node PD_CN (for example, the pull-down control node PD2_CN), the second sub-power terminal VDD2, the other pull-down node PD (for example, the pull-down node PD2), the third sub-power terminal VGL1, and the second pull-up node PU2 respectively.

In the two pull-down sub-circuits 403, one pull-down sub-circuit 403 may be connected to one pull-down node PD (for example, the pull-down node PD1), the third sub-power terminal VGL1, the fourth sub-power terminal VGL2, the first pull-up node PU1, the first output terminal OUT1, and the second output terminal OUT2 respectively. The other pull-down sub-circuit 403 may be connected to the other pull-down node PD (for example, the pull-down node PD2), the third sub-power terminal VGL1, the fourth sub-power terminal VGL2, the first pull-up node PU1, the first output terminal OUT1, and the second output terminal OUT2 respectively.

When the potential of the first sub-power signal provided by the first sub-power terminal VDD1 is the first potential, the potential of the second sub-power signal provided by the second sub-power terminal VDD2 may be the second potential. At this time, in the two first control sub-circuits 401 and the two second control sub-circuits 402, one first control sub-circuit 401 connected to the first sub-power terminal VDD1 and one second control sub-circuit 402 connected to the first sub-power terminal VDD1 may be in an operating state. The other first control sub-circuit 401 connected to the second sub-power terminal VDD2 and the other second control sub-circuit 402 connected to the second sub-power terminal VDD2 may be in a non-operating state.

When the potential of the second sub-power signal provided by the second sub-power terminal VDD2 is the first potential, the potential of the first sub-power signal provided by the first sub-power terminal VDD1 may be the second potential. At this time, in the two first control sub-circuits 401 and the two second control sub-circuits 402, one first control sub-circuit 401 connected to the second sub-power terminal VDD2, and one second control sub-circuit 402 connected to the second sub-power terminal VDD2 may be in an operating state. The other first control sub-circuit 401 connected to the first sub-power terminal VDD1 and the other second control sub-circuit 402 connected to the first sub-power terminal VDD1 may be in a non-operating state.

According to the above analysis, it may be known that by setting the first sub-power terminal VDD1 and the second sub-power terminal VDD2 of which the potentials of the output signals are complementary, the operating duration of each control sub-circuit in the first control sub-circuits 401 and the second control sub-circuits 402 may be reduced. Therefore, the threshold voltages of the transistors in the first control sub-circuits 401 and the second control sub-circuits 402 may be shifted to a lesser degree, the operating stability of the shift register unit is improved, and further the service life of the shift register unit is prolonged.

Figure 5:
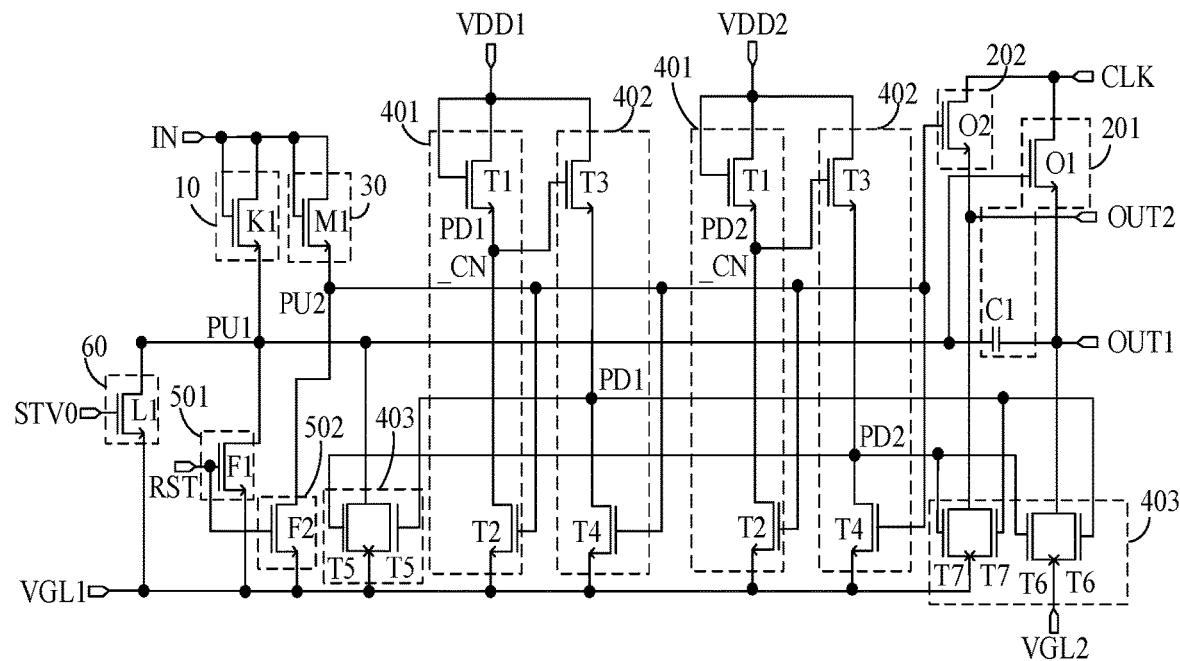
FIG. 5 is a schematic structural diagram of one additional shift register unit according to an embodiment of the present disclosure.

FIG. 5 is a schematic structural diagram of one additional shift register unit 30 according to an embodiment of the present disclosure. As shown in FIG. 5, the pull-down control circuit 30 may include: a pull-down control transistor M1.

Both a gate and a first electrode of the pull-down control transistor M1 may be connected to the input signal terminal IN, and a second electrode of the pull-down control transistor M1 may be connected to the second pull-up node PU2.

Figure 6:
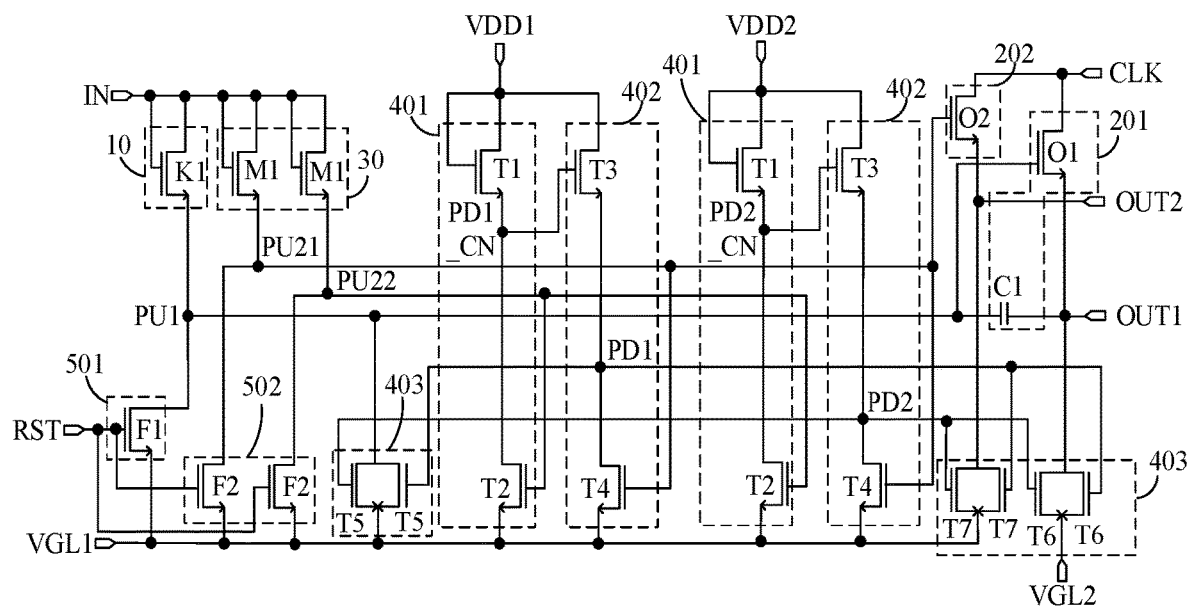
FIG. 6 is a schematic structural diagram of one more shift register unit according to an embodiment of the present disclosure.

Optionally, FIG. 6 is a schematic structural diagram of one more shift register unit according to an embodiment of the present disclosure. Referring to FIG. 6, the pull-down control circuit 40 may include: two pull-down control transistors M1, and the second pull-up node PU2 may include a first sub-pull-up node PU21 and a second sub-pull-up node PU22.

A gate and a first electrode of each pull-down control transistor M1 may be connected to the input signal terminal IN, wherein a second electrode of one pull-down control transistor M1 may be connected to the first sub-pull-up node PU21, and a second electrode of the other pull-down control transistor M1 may be connected to the second sub-pull-up node PU22.

The first control sub-circuit 401 may be connected to the first sub-pull-up node PU21, and the second control sub-circuit 402 may be connected to the second sub-pull-up node PU22. As shown in FIG. 6, the first control sub-circuit 401 may also be connected to the second sub-pull-up node PU22, and the second control sub-circuit 402 may be connected to the first sub-pull-up node PU21. That is, two sub-pull-up nodes may be disposed to perform noise reduction on the pull-down control node PD_CN and the pull-down node PD respectively.

Optionally, referring to FIG. 5 and FIG. 6, the first control sub-circuit 401 may include: a first transistor T1 and a second transistor T2, and the second control sub-circuit 402 may include: a third transistor T3 and a fourth transistor T4. The pull-down sub-circuit 403 may include: a fifth transistor T5, a sixth transistor T6, and a seventh transistor T7.

A gate and a first electrode of the first transistor T1 may be connected to the first power terminal VDD, and a second electrode of the first transistor T1 may be connected to the pull-down control node PD_CN.

A gate of the second transistor T2 may be connected to the second pull-up node PU2, a first electrode of the second transistor T2 may be connected to the second power terminal VGL, and a second electrode of the second transistor T2 is connected to the pull-down control node PD_CN.

A gate of the third transistor T3 may be connected to the pull-down control node PD_CN, a first electrode of the third transistor T3 may be connected to the first power terminal VDD, and a second electrode of the third transistor T3 may be connected to the pull-down node PD.

A gate of the fourth transistor T4 may be connected to the second pull-up node PU2, a first electrode of the fourth transistor T4 may be connected to the second power terminal VGL, and a second electrode of the fourth transistor T4 may be connected to the pull-down node PD.

Gates of the fifth transistor T5, the sixth transistor T6, and the seventh transistor T7 may be all connected to the pull-down node PD. First electrodes of the fifth transistor T5, the sixth transistor T6, and the seventh transistor T7 may be all connected to the second power terminal VGL. Second electrode of the fifth transistor T5 may be connected to the first pull-up node PU1, and both a second electrode of the sixth transistor T6 and a second electrode of the seventh transistor T7 may be connected to the output terminal OUT. For example, referring to FIG. 5 and FIG. 6, the second electrode of the sixth transistor T6 may be connected to the first output terminal OUT1, and the second electrode of the seventh transistor T7 may be connected to the second output terminal OUT2.

Exemplarily, with continued reference to FIG. 5 and FIG. 6, the pull-down circuit 40 may include: two first transistors T1, two second transistors T2, two third transistors T3, two fourth transistors T4, and two fifths transistors T5, two sixth transistors T6 and two seventh transistors T7.

A gate and a first electrode of one first transistor T1, and a first electrode of one third transistor T3 may be connected to the first sub-power terminal VDD1, and a gate and a first electrode of the other first transistor T1 and a first electrode of the other third transistor T3 may be all connected to the second sub-power terminal VDD2.

First electrodes of the two second transistors T2, first electrodes of the two fourth transistors T4, first electrodes of the two fifth transistors T5, and first electrodes of the two seventh transistors T7 may be all connected to the third sub-power terminal VGL1, and first electrodes of the two sixth transistors T6 may be both connected to the fourth sub-power terminal VGL2.

Second electrodes of the two sixth transistors T6 may be both connected to the first output terminal OUT1, and second electrodes of the two seventh transistors T7 may be both connected to the second output terminal OUT2.

Moreover, as shown in FIG. 5 and FIG. 6, the second electrode of one first transistor T1 may be connected to one pull-down control node PD_CN (for example, PD1_CN), and the second electrode of the other first transistor T1 may be connected to the other pull-down control node PD_CN (for example, PD2_CN). The gates of the two second transistors T2 may be both connected to the second pull-up node PU2, the second electrode of one second transistor T2 may be connected to one pull-down control node PD_CN, and the second electrode of the other second transistor T2 may be connected to the other pull-down control node PD_CN. The gate of one third transistor T3 may be connected to one pull-down control node PD_CN, and the second electrode of the one third transistor T3 may be connected to one pull-down node PD (for example, PD1). The gate of the other third transistor T3 may be connected to the other pull-down control node PD_CN, and the second electrode of the other third transistor T3 may be connected to the other pull-down node PD (for example, PD2). The gates of the two fourth transistors T4 may be connected to the second pull-up node PU2. The second electrode of one fourth transistor T4 may be connected to one pull-down node PD, and the second electrode of the other fourth transistor T4 may be connected to the other pull-down node PD. The gates of one fifth transistor T5, one sixth transistor T6, and one seventh transistor T7 may be connected to one pull-down node PD, and the gates of the other fifth transistor T5, the other sixth transistor T6, and the other seventh transistor T7 may be connected to the other pull-down node PD, and the gates of the two fifth transistors T5 may be both connected to the first pull-up node PU1.

In one implementation, referring to FIG. 6, when the second pull-up node PU2 includes the first sub-pull-up node PU21 and the second sub-pull-up node PU22, the second transistor T2 and the fourth transistor T4 may be connected to different sub-pull-up nodes. For example, referring to FIG. 6, in the shift register unit shown in FIG. 6, the gates of the two second transistors T2 may be both connected to the second sub-pull-up node PU22, and the gates of the two fourth transistors T2 may be both connected to the first sub-pull-up node PU21. Of course, the gates of the two second transistors T2 may be both connected to the first sub-pull-up node PU21; and the gates of the two fourth transistors T2 may be both connected to the second sub-pull-up node PU22, which is not limited by the embodiment of the present disclosure.

Optionally, referring to FIG. 5 and FIG. 6, the first reset sub-circuit 501 may include: a first reset transistor F1. The second reset sub-circuit 502 may include: a second reset transistor F2.

A gate of the first reset transistor F1 may be connected to the reset signal terminal RST, a first electrode of the first reset transistor F1 may be connected to the second power terminal VGL, and a second electrode of the first reset transistor F1 may be connected to the first pull-up node PU1.

A gate of the second reset transistor F2 may be connected to the reset signal terminal RST, a first electrode of the second reset transistor F2 may be connected to the second power terminal VGL, and a second electrode of the second reset transistor F2 may be connected to the second pull-up node PU2.

Exemplarily, referring to FIG. 5 and FIG. 6, the first electrodes of the first reset transistor F1 and the second reset transistor F2 may be both connected to the third sub-power terminal VGL1 included in the second power terminal VGL.

Besides, referring to FIG. 6, when the second pull-up node PU2 includes the first sub-pull-up node PU21 and the second sub-pull-up node PU22, in order to achieve the reliable reset of the two sub-pull-up nodes, the second reset sub-circuit 502 may include two second reset transistors F2.

A second electrode of one second reset transistor F2 may be connected to the first sub-pull-up node PU21, and a second reset transistor F2 may output the second power signal at the second potential to the first sub-pull-up node PU21 under control of the reset signal, thereby realizing the reset of the first sub-pull-up node PU21. A second electrode of the other second reset transistor F2 may be connected to the second sub-pull-up node PU22, and a second reset transistor F2 may output the second power signal at the second potential to the second sub-pull-up node PU22 under control of the reset signal, thereby realizing the reset of the second sub-pull-up node PU22.

Optionally, referring to FIG. 5 and FIG. 6, the first output sub-circuit 201 may include: a first output transistor O1 and a capacitor C1. The second output sub-circuit 202 may include: a second output transistor O2.

A gate of the first output transistor O1 may be connected to the first pull-up node PU1, a first electrode of the first output transistor O1 may be connected to the clock signal terminal CLK, and a second electrode of the first output transistor O1 may be connected to the first output terminal OUT.

One terminal of the capacitor C1 may be connected to the first pull-up node PU1, and the other terminal of the capacitor C1 may be connected to the first output terminal OUT.

A gate of the second output transistor O2 may be connected to the second pull-up node PU2, a first electrode of the second output transistor O2 may be connected to the clock signal terminal CLK, and a second electrode of the second output transistor O2 may be connected to the second output terminal OUT.

In an implementation, when the second pull-up node PU2 includes the first sub-pull-up node PU21 and the second sub-pull-up node PU22, the gate of the second output transistor O2 may be connected to any sub-pull-up node of the first sub-pull-up node PU21 and the second sub-pull-up node PU22. For example, referring to FIG. 6, it shows that the gate of the second output transistor O2 is connected to the first sub-pull-up node PU21.

In the embodiment of the present disclosure, the pull-down control sub-circuit 30 may output the input signal at the first potential to the second pull-up node PU2 when the potential of the input signal is the first potential, and the potential of the second pull-up node PU2 is not pulled up by the bootstrap effect of the capacitor C1. Moreover, the first pull-down control sub-circuit 401 performs noise reduction on the pull-down control node PD_CN when the potential of the second pull-up node PU2 is the first potential, and the second pull-down control sub-circuit 402 performs noise reduction on the pull-down node PD when the potential of the second pull-up node PU2 is the first potential. Based on the above analysis, it may be seen that in the solution according to the embodiment of the present disclosure, under the premise of performing noise reduction on the pull-down node PD and charging the first pull-up node PU1 and the second pull-up node PU2 at the same time, when the pull-down circuit 40 performs noise reduction on the pull-down node PD, the problem that the threshold voltage shift of the transistors is relatively serious due to the larger gate voltages of the transistors included in the pull-down circuit 40 (that is, the second transistor T2 and the fourth transistor T4) is avoided, and the service life of the shift register unit is prolonged. Moreover, the problem of insufficient charging of the transistors after the shift register unit is used for a long time is improved.

Optionally, referring to FIG. 5 and FIG. 6, the input circuit 10 may include: an input transistor K1.

Both the gate and the first electrode of the input transistor K1 may be connected to the input signal terminal IN, and the second electrode of the input transistor K1 may be connected to the first pull-up node PU1.

In one implementation manner, referring to FIG. 5, the shift register unit may further include an initial reset circuit 60, which may be connected to an initial reset signal terminal STV0, the first pull-up node PU1, and the second power terminal VGL respectively.

For example, referring to FIG. 5, the initial reset circuit 60 may be connected to the third sub-power terminal VGL1. The initial reset circuit 60 may output the third sub-power signal at the second potential to the first pull-up node PU1 in response to the initial reset signal provided by the initial reset signal terminal STV0, thereby achieving noise reduction for the first pull-up node PU1.

Optionally, referring to FIG. 5, the initial reset circuit 60 may include an initial reset transistor L1, the gate of the initial reset transistor L1 may be connected to the initial reset signal terminal STV0, and the first electrode of the initial reset transistor L1 may be connected to the third sub-power terminal VGL1. The second electrode of the initial reset transistor L1 may be connected to the first pull-up node PU1.

Optionally, the initial reset circuit 60 may also be connected to the second pull-up node PU2, and the initial reset circuit 60 may also output the third sub-power signal at the second potential to the second pull-up node PU2 in response to the initial reset signal, thereby achieving noise reduction for the second pull-up node PU2. Correspondingly, the initial reset circuit 60 may include two initial reset transistors, the second electrode of one initial reset transistor may be connected to the first pull-up node, and the second electrode of the other initial reset transistor may be connected to the second pull-up node.

In the above respective embodiments, the illustration is given by taking the fact that each transistor is an N-type transistor and the first potential is a low potential relative to the second potential as an example. Nevertheless, each transistor may also use a P-type transistor. When each transistor uses the P-type transistor, the first potential is a high potential relative to the second potential. The shift register unit may be an alternating current drive model or a direct current drive model.

In summary, the embodiment of the present disclosure provides a shift register unit. The shift register unit includes the pull-down control circuit, the pull-down circuit, and the reset circuit. The pull-down control circuit is capable of controlling the potential of the second pull-up node under control of the input signal provided by the input signal terminal, and the pull-down circuit is capable of performing noise reduction on the first pull-up node and the output terminal under control of the second pull-up node. The reset circuit is capable of performing noise reduction on the two pull-up nodes under control of the reset signal. By disposing the reset circuit to perform noise reduction on the pull-up nodes, the reliable noise reduction of the first pull-up node and the output terminal by the pull-down circuit after the output stage is ensured. Moreover, since the potential of the input signal, that is, the potential of the second pull-up node is not pulled up due to the bootstrap effect, relative to the related art, the solution according to the embodiment of the present disclosure ensures that the threshold voltages of the transistors in the pull-down circuit are shifted to a lesser degree under the premise of reliable noise reduction for the first pull-up node and the output terminal, and the service life of the shift register unit is relatively long.

Figure 7:
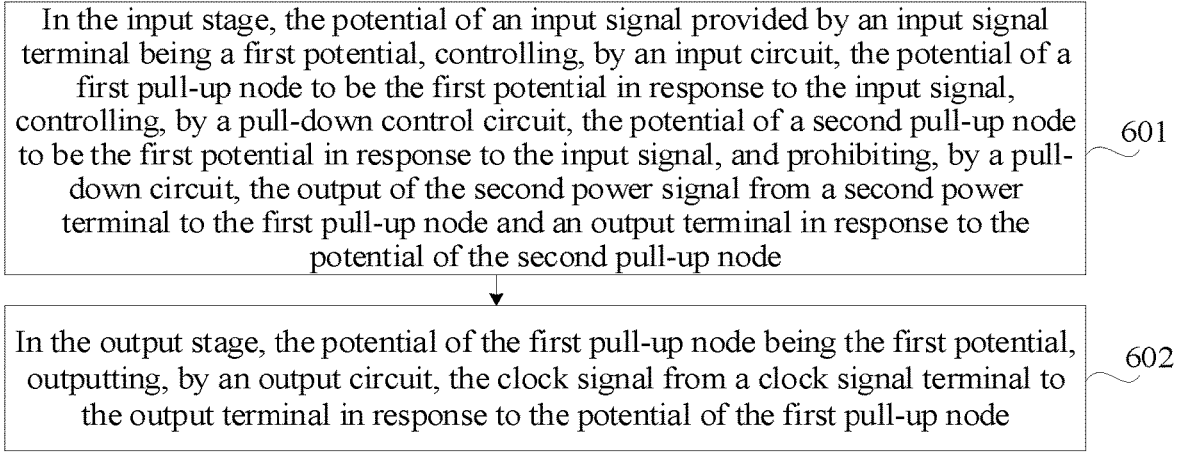
FIG. 7 is a flowchart of a method for driving a shift register unit according to an embodiment of the present disclosure.

FIG. 7 is a flowchart of a method for driving a shift register unit according to an embodiment of the present disclosure. The method may be applicable to driving the shift register unit according to the above embodiment. For example, the method may be employed to drive the shift register unit as shown in any one of FIG. 1 to FIG. 6. As shown in FIG. 7, the method may include the following steps:

In step 601, at an input stage where the potential of the input signal provided by the input signal terminal is the first potential, the input circuit controls the potential of the first pull-up node to be the first potential in response to the input signal. The pull-down control circuit controls the potential of the second pull-up node to be the first potential in response to the input signal. In response to the potential of the second pull-up node, the pull-down circuit prohibits the output of the second power signal from the second power terminal to the first pull-up node and the output terminal.

Exemplarily, at the input stage, the input circuit may output the input signal at the first potential to the first pull-up node under control of the input signal, so as to charge the first pull-up node. At the same time, the pull-down control circuit may output the input signal at the first potential to the second pull-up node under control of the input signal, so as to charge the second pull-up node. At this time, the pull-down circuit does not output the second power signal from the second power terminal to the first pull-up node and the output terminal in response to the potential of the second pull-up node, that is, does not perform noise reduction on the first pull-up node and the output terminal.

In step 602, at an output stage where the potential of the first pull-up node is the first potential, the output circuit outputs the clock signal from the clock signal terminal to the output terminal in response to the potential of the first pull-up node.

Exemplarily, at the output stage, the output circuit may output the clock signal at the first potential to the output terminal under control of the first pull-up node, thereby achieving the scanning of a row of pixels.

In summary, the embodiment of the present disclosure provides a method for driving a shift register unit. The pull-down control circuit is capable of controlling the potential of the second pull-up node under control of the input signal provided by the input signal terminal, and the pull-down circuit is capable of performing noise reduction on the first pull-up node and the output terminal under control of the second pull-up node. Since the potential of the input signal, that is, the potential of the second pull-up node will not be pulled up due to the bootstrap effect, the threshold voltages of the transistors in the pull-down circuit may be less shifted, and the service life of the shift register unit is relatively long.

Figure 8:
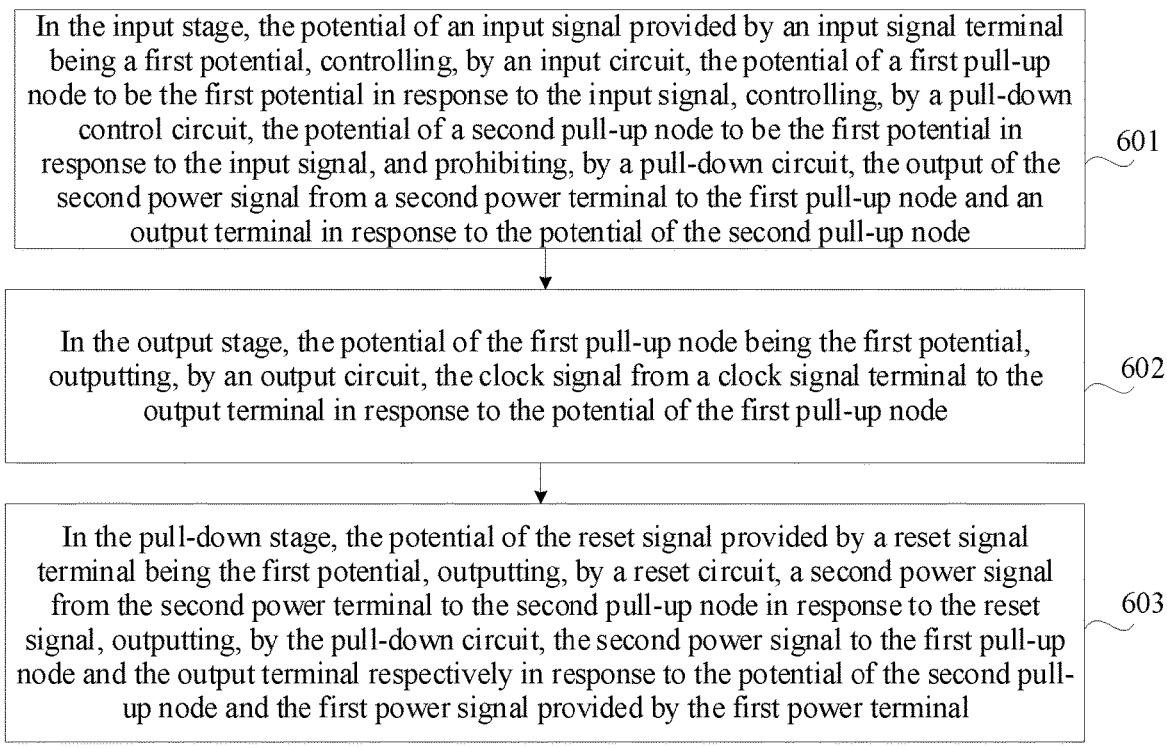
FIG. 8 is a flowchart of another method for driving a shift register unit according to an embodiment of the present disclosure.

FIG. 8 is a flowchart of another method for driving a shift register unit according to an embodiment of the present disclosure. As shown in FIG. 8, after the above step 602, the method may further include the following steps:

In step 603, at an pull-down stage where the potential of the reset signal provided by the reset signal terminal is the first potential, the reset circuit outputs the second power signal from the second power terminal to the second pull-up node in response to the reset signal. The pull-down circuit outputs the second power signal to the first pull-up node and the output terminal respectively in response to the potential of the second pull-up node and the first power signal provided by the first power terminal.

In the embodiment of the present disclosure, the potential of the first power signal may be the first potential, and the potential of the second power signal may be the second potential. Exemplarily, after the output stage, the potential of the reset signal provided by the reset signal terminal may be the first potential. At this time, the reset circuit may output the second power signal at the second potential to the second pull-up node under control of the reset signal, thereby achieving noise reduction for the second pull-up node. Furthermore, the pull-down circuit is capable of outputting the second power signal at the second potential to the first pull-up node and the output terminal respectively under control of the potential of the second pull-up node and the first power signal at the first potential, thereby achieving noise reduction for the first pull-up node and the output terminal.

By taking the shift register unit shown in FIG. 5 as an example, and taking an N-type transistor as an example of each transistor in the shift register unit, referring to FIG. 9 in the following drive period, the drive principle of the shift register unit according to the embodiment of the present disclosure is described hereinafter in detail by taking the following as an example: the potential of the first sub-power signal provided by the first sub-power terminal VDD1 is the first potential, the potential of the second sub-power signal provided by the second sub-power terminal VDD2 is the second potential, and the first potential is a high potential relative to the second potential. Optionally, referring to FIG. 9, it may also be seen that the duration of the power signals provided by the first sub-power terminal VDD1 and the second sub-power terminal VDD2 at the first potential in each period is 2 seconds (s). Moreover, the duty ratio of the power signals provided by the first sub-power terminal VDD1 and the second sub-power terminal VDD2 may be one half, that is, the potentials of the first sub-power terminal VDD1 and the second sub-power terminal VDD2 may interchange once every 2 s.

Figure 9:
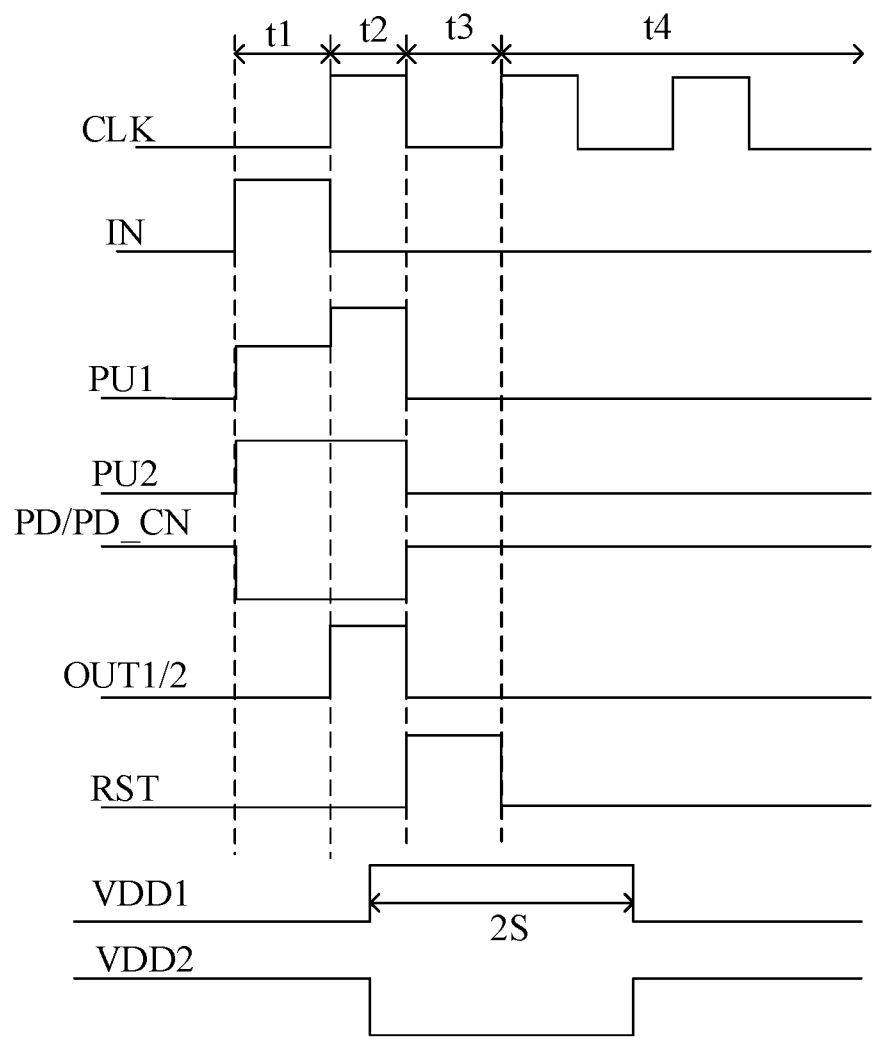
FIG. 9 is a timing diagram of signal terminals of a shift register unit according to an embodiment of the present disclosure.

Exemplarily, as shown in FIG. 9, at the input stage t1, the potential of the input signal provided by the input signal terminal IN is the first potential, and both the input transistor K1 and the pull-down control transistor M1 are turned on. The input signal terminal IN may output the input signal at the first potential to the first pull-up node PU1 by the input transistor K1, so as to pre-charge the first pull-up node PU1. In addition, the input signal terminal IN may also output the input signal at the first potential to the second pull-up node PU2 by the pull-down control transistor M1, so as to charge the second pull-up node PU2. At this time, the two second transistors T2 and the two fourth transistors T4 are turned on.

Correspondingly, referring to FIG. 9, at the input stage t1, the third sub-power terminal VGL1 may output the third sub-power signal at the second potential to the pull-down control node PD1_CN by one second transistor T2, may output the third sub-power signal at the second potential to the pull-down control node PD2_CN by the other second transistor T2, may output the third sub-power signal at the second potential to the pull-down node PD1 by one fourth transistor T4, and may output the third sub-power signal at the second potential to the pull-down node PD2 by the other fourth transistor T4, thereby achieving noise reduction for the two pull-down control nodes and the two pull-down nodes. Correspondingly, the two third transistors T3, the two fifth transistors T5, the two sixth transistors T6 and the two seventh transistors T7 are all turned off. The fifth transistors T5 are prevented from outputting the third sub-power signal at the second potential to the first pull-up node PU1, the sixth transistors T6 are prevented from outputting the fourth sub-power signal at the second potential to the first output terminal OUT1, and the seventh transistors T7 are prevented from outputting the third sub-power signal at the second potential to the second output terminal OUT2, that is, the operating reliability of the shift register unit is guaranteed.

As shown in FIG. 9, in the output stage t2, the potential of the input signal provided by the input signal terminal IN jumps to the second potential, and the input transistor K1 is turned off. The potential of the clock signal provided by the clock signal terminal CLK is the first potential, and the potential of the first pull-up node PU1 is further pulled up by the bootstrap effect of the capacitor C1. Since the size of the first output transistor O1 is larger than the size of the second output transistor O2, the potential of the first pull-up node PU1 is pulled up by the bootstrap effect, thereby ensuring that the first output transistor O1 is fully turned on. In the output stage t2, the potential of the second pull-up node PU2 is maintained at the first potential written in the input stage t1, and the second output transistor O2 is turned on. The clock signal terminal CLK outputs the clock signal at the first potential to the first output terminal OUT1 by the first output transistor O1, and outputs the clock signal at the first potential to the second output terminal OUT2 by the second output transistor O2.

The first output terminal OUT1 is connected to one gate line, and the second output terminal OUT2 is connected to the input signal terminal IN of a shift register unit at a next stage. Therefore, in the output stage t2, the first output terminal OUT1 may output the clock signal to one gate line connected thereto, thereby providing a gate drive signal for pixels connected to the gate line. The second output terminal OUT2 may output the clock signal to the input signal terminal IN of the shift register unit at the next stage, thereby driving a shift register unit at a next stage to operate.

Furthermore, referring to FIG. 9, at the output stage t2, since the potential of the second pull-up node PU2 is still maintained at the first potential, the two second transistors T2 and the two fourth transistors T4 are still turned on. Correspondingly, in this output stage t2, the third sub-power terminal VGL1 may continue to output the third sub-power signal at the second potential to the pull-down control node PD1_CN by one second transistor T2, output the third sub-power signal at the second potential to the pull-down control node PD2_CN by the other second transistor T2, output the third sub-power signal at the second potential to the pull-down node PD1 by one fourth transistor T4, and output the third sub-power signal at the second potential to the pull-down node PD2 by the other fourth transistor T4, thereby achieving continuous noise reduction for the two pull-down control nodes and the two pull-down nodes.

Since at the output stage t2, the potential of the first pull-up node PU1 is doubled with respect to the input stage t1 under the bootstrap effect. For example, it is assumed that the potential of the first pull-up node PU1 is pre-charged to the potential VGH in the input stage t1, then in the output stage t2, the potential of the first pull-up node PU1 may become 2VGH under the bootstrap effect. Since the gates of the transistors (that is, the second transistor T2 and the fourth transistor T4) which perform noise reduction on the potentials of the pull-down node and the pull-down control node in the related art are connected to the first pull-up node PU1, the threshold voltage shift of the second transistor T2 and the fourth transistor T4 may be relatively serious in the output stage t2.

However, in the embodiment of the present disclosure, potentials of the gates of the second transistor T2 and the fourth transistor T4 are controlled by using the input signal, and the potential of the input signal (that is, the potential of the second pull-up node PU2) will not be pulled up under the effect of bootstrap. Therefore, relative to the related art, the solution according to the embodiment of the present disclosure reduces the gate bias voltages of the second transistor T2 and the fourth transistor T4, thereby reducing the threshold voltage shift of the second transistor T2 and the fourth transistor T4 and prolonging the service life of the shift register unit.

Referring to FIG. 9, at the pull-down stage t3, the potential of the reset signal provided by the reset signal terminal RST is the first potential, and both the first reset transistor F1 and the second reset transistor F2 are turned on. The third sub-power terminal VGL1 may output the third sub-power signal at the second potential to the first pull-up node PU1 by the first reset transistor F1, and may output the third sub-power signal at the second potential to the second pull-up node PU2 by the second reset transistor F2, thereby achieving the resetting of the first pull-up node PU1 and the second pull-up node PU2.

In addition, during the drive period, the potential of the first sub-power signal provided by the first sub-power terminal VDD1 is the first potential, and the potential of the second sub-power signal provided by the second sub-power terminal VDD2 is the second potential. Therefore, at the pull-down stage t3, the first transistor T1 connected to the first sub-power terminal VDD1 may be turned on, and the first sub-power terminal VDD1 may output the first sub-power signal at the first potential to the pull-down control node PD1_CN by the first transistor T1, and the third transistor T3 connected to the pull-down control node PD1_CN may be turned on. The first sub-power terminal VDD1 may output the first sub-power signal at the first potential to the pull-down node PD1 by the third transistor T3. Correspondingly, one fifth transistor T5, one sixth transistor T6 and one seventh transistor T7 are all turned on. The third sub-power terminal VGL1 may output the third sub-power signal at the second potential to the first pull-up node PU1 by one fifth transistor T5, and output the third sub-power signal at the second potential to the second output terminal OUT2 by one seventh transistor T7. The fourth sub-power terminal VGL2 may output the fourth sub-power signal at the second potential to the first output terminal OUT1 by one sixth transistor T6. Therefore, the noise reduction for the first pull-up node PU1, the first output terminal OUT1, and the second output terminal OUT2 is achieved.

In the embodiment of the present disclosure, referring to FIG. 9, after the pull-down stage t3, the method may further include a noise reduction stage t4.

At the noise reduction stage t4, the potential of the first sub-power signal provided by the first sub-power terminal VDD1 and the potential of the second sub-power signal provided by the second sub-power terminal VDD2 alternately become the first potential. The first transistor T1 connected to the sub-power terminal providing the sub-power signal of the first potential may be turned on, and the power terminal may further output the sub-power signal at the first potential to the pull-down control node PD_CN by the first transistor T1. The third transistor T3 connected to the pull-down control node PD_CN is turned on. The power terminal providing the sub-power signal of the first potential may output the first sub-power signal at the first potential to the pull-down node PD by the third transistor T3. Correspondingly, one fifth transistor T5, one sixth transistor T6 and one seventh transistor T7 are turned on. The third sub-power terminal VGL1 may output the third sub-power signal at the second potential to the first pull-up node PU1 and the second output terminal OUT2 respectively, and the fourth sub-power terminal VGL2 may output the fourth sub-power signal at the second potential to the first output terminal OUT1. At the noise reduction stage t4, the third sub-power terminal VGL1 and the fourth sub-power terminal VGL2 may achieve continuous noise reduction for the first pull-up node PU1, the first output terminal OUT1, and the second output terminal OUT2.

The structure of the shift register unit and the method for driving the shift register unit according to the embodiments of the present disclosure effectively solves the display abnormality of the 27-architecture GOA, and preferentially address the problem of drifting of the transistor characteristics of the shift register unit in the 75-inch display device.

In summary, the embodiment of the present disclosure provides a method for driving a shift register unit. The pull-down control circuit is capable of controlling the potential of the second pull-up node under control of the input signal provided by the input signal terminal. The pull-down circuit is capable of performing noise reduction on the first pull-up node and the output terminal under control of the second pull-up node. The reset circuit is capable of performing noise reduction on the two pull-up nodes under control of the reset signal. By setting the reset circuit to perform noise reduction on the pull-up nodes, the reliable noise reduction for the first pull-up node and the output terminal by the pull-down circuit after the output stage is ensured. Moreover, since the potential of the input signal, that is, the potential of the second pull-up node will not be pulled up due to the bootstrap effect, relative to the related art, under the premise of ensuring reliable noise reduction of the first pull-up node and the output terminal, the threshold voltages of the transistors in the pull-down circuit are shifted to a lesser degree shifted, and the service life of the shift register unit is relatively long.

Figure 10:
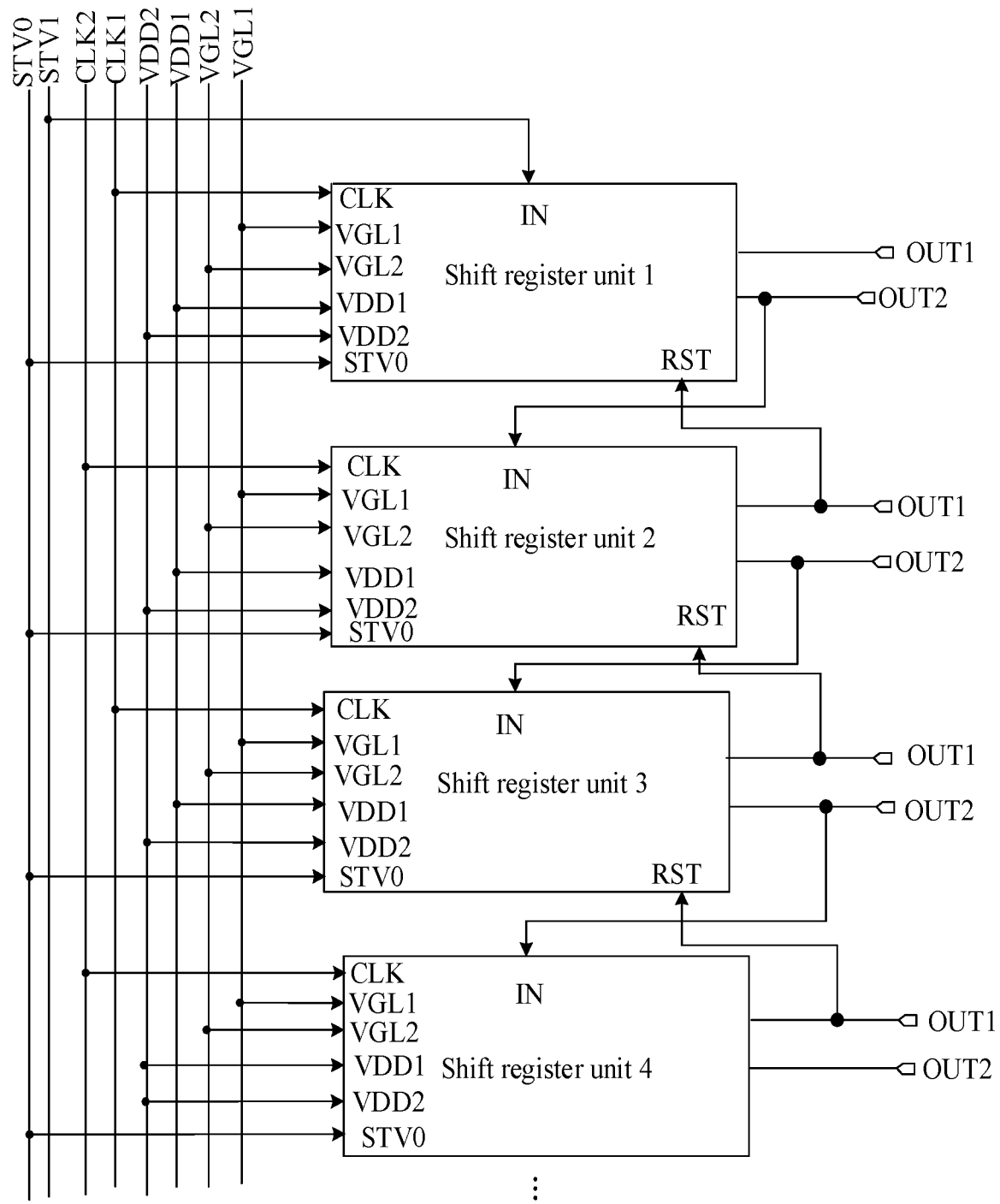
FIG. 10 is a schematic structural diagram of a gate drive circuit according to an embodiment of the present disclosure.

FIG. 10 is a schematic structural diagram of a gate drive circuit according to an embodiment of the present disclosure. As shown in FIG. 10, the gate drive circuit may include: at least two cascaded shift register units. For example, FIG. 10 shows cascaded N shift register units, wherein N is an integer greater than 2. Each shift register unit may be the shift register unit as shown in any one of FIG. 1 to FIG. 6.

It may be seen with reference to FIG. 10 that the first output terminal OUT1 of the shift register unit at each stage may be connected to one gate line (not shown in FIG. 10), thereby achieving the function of providing a gate signal to the gate line. The first output terminal OUT1 may be connected to the reset signal terminal RST of the shift register unit at a previous stage. The second output terminal OUT2 of the shift register unit at each stage may be connected to the input signal terminal IN of the shift register unit at a next stage, thereby realizing the shift function of the gate drive circuit.

For example, referring to FIG. 10, the second output terminal OUT2 of the shift register unit at the first stage may be connected to the input signal terminal IN of the shift register unit at the second stage. Optionally, referring to FIG. 10, the input signal terminal IN of the shift register unit at the first stage may be connected to the start signal terminal STV1, and shift register unit at each stage may also be connected to the initial reset signal terminal STV0, the first sub-power terminal VDD1 2, the second sub-power terminal VDD2, the third sub-power terminal VGL1 and the fourth sub-power terminal VGL2.

The gate drive circuit may be provided with two clock signal terminals CLK1 and CLK2, that is, the gate drive circuit may use a two-phase clock. In the multiple cascaded shift register units included in the gate drive circuit, each shift register unit may be connected to one of the two clock signal terminals, and the clock signal terminals connected to two adjacent shift register units may be different.

Figure 11:
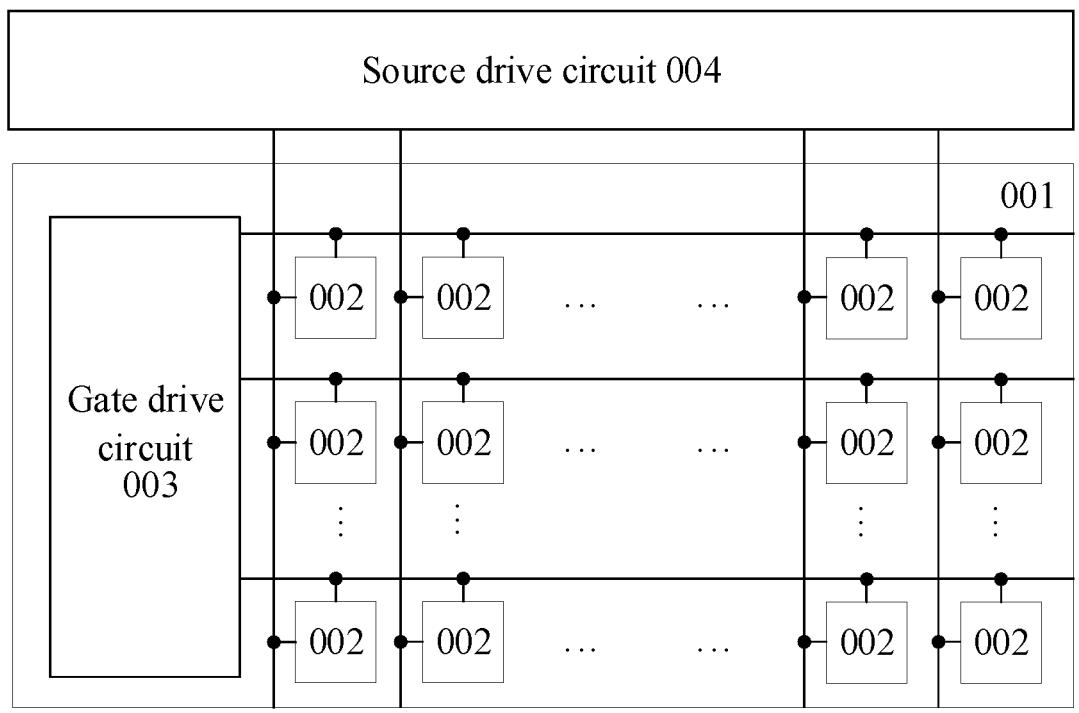
FIG. 11 is a schematic structural diagram of a display device according to an embodiment of the present disclosure.

Optionally, the embodiment of the present disclosure further provides a display device. As shown in FIG. 11, the display device may include a base substrate 001, a plurality of pixel units 002 disposed on the base substrate 001, and a gate drive circuit 003 as provided in the above embodiment and connected to the multiple pixel units 002. The gate drive circuit 003 may be the gate drive circuit as shown in FIG. 10. Besides, as shown in FIG. 11, the gate drive circuit 003 may be disposed on the base substrate 001.

Referring to FIG. 11, the display device may further include a electrode drive circuit 004. The plurality of pixel units 002 are arranged in an array. The gate drive circuit 003 is connected to respective rows of pixel units 002 by a plurality of gate lines, and is configured to provide gate drive signals for respective rows of pixel units 002. The source drive circuit 004 is connected to respective columns of pixel units 002 by a plurality of data lines, and is configured to provide data signals for respective columns of pixel units 002.

In the embodiment of the present disclosure, the display device may be: any product or component with a display function, such as a liquid crystal panel, electronic paper, an organic light-emitting diode (OLED) panel, an active-matrix OLED (AMOLED) panel, a mobile phone, a tablet computer, a television, a display, a notebook computer, a digital photo frame, and a navigator.

A person skilled in the art may clearly understand that, for the convenience and brevity of the description, for the specific operating process of the gate drive circuit, shift register unit and respective circuits and sub-circuits, reference may be made to the corresponding process in the above method embodiments, and details are not described herein again.

Described above are merely optional embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A shift register unit, comprising: an input circuit, an output circuit, a pull-down control circuit, and a pull-down circuit; wherein
the input circuit is connected to an input signal terminal and a first pull-up node respectively, and the input circuit is configured to control a potential of the first pull-up node in response to an input signal provided by the input signal terminal;
the output circuit is connected to the first pull-up node, a clock signal terminal, and an output terminal respectively, and the output circuit is configured to output a clock signal from the clock output terminal to the output terminal in response to the potential of the first pull-up node;
the pull-down control circuit is connected to the input signal terminal and a second pull-up node respectively, and the pull-down control circuit is configured to control a potential of the second pull-up node in response to the input signal; and
the pull-down circuit is connected to a first power terminal, a second power terminal, the first pull-up node, the second pull-up node, and the output terminal respectively, and the pull-down circuit is configured to output a second power signal from the second power terminal to the first pull-up node and the output terminal respectively in response to the potential of the second pull-up node and a first power signal provided by the first power terminal,
wherein the pull-down circuit comprises: a first control sub-circuit, a second control sub-circuit, and a pull-down sub-circuit; wherein
the first control sub-circuit is connected to the first power terminal, the second power terminal, the pull-down control node, and the second pull-up node respectively, and the first control sub-circuit is configured to output the first power signal to the pull-down control node in response to the first power signal, and output the second power signal to the pull-down control node in response to the potential of the second pull-up node;
the second control sub-circuit is connected to the first power terminal, the second power terminal, the pull-down control node, the pull-down node, and the second pull-up node respectively, and the second control sub-circuit is configured to output the first power signal to the pull-down node in response to the potential of the pull-down control node, and output the second power signal to the pull-down node in response to the potential of the second pull-up node; and
the pull-down sub-circuit is connected to the pull-down node, the first pull-up node, the output terminal, and the second power terminal respectively, and the pull-down sub-circuit is configured to output the second power signal to the first pull-up node and the output terminal respectively in response to a potential of the pull-down node.

2. The shift register unit according to claim 1, wherein the pull-down control circuit comprises: a pull-down control transistor;
wherein both a gate and a first electrode of the pull-down control transistor are connected to the input signal terminal, and a second electrode of the pull-down control transistor is connected to the second pull-up node.

3. The shift register unit according to claim 1, wherein the pull-down control circuit comprises: two pull-down control transistors, and the second pull-up node comprises: a first sub-pull-up node and a second sub-pull-up node; wherein
both a gate and a first electrode of each pull-down control transistor are connected to the input signal terminal, wherein a second electrode of one of the pull-down control transistors is connected to the first sub-pull-up node, and a second electrode of the other pull-down control transistor is connected to the second sub-pull-up node; and
the first control sub-circuit is connected to the first sub-pull-up node, and the second control sub-circuit is connected to the second sub-pull-up node.

4. The shift register unit according to claim 1, wherein the first control sub-circuit comprises: a first transistor and a second transistor; wherein
both a gate and a first electrode of the first transistor are connected to the first power terminal, and a second electrode of the first transistor is connected to the pull-down control node; and
a gate of the second transistor is connected to the second pull-up node, a first electrode of the second transistor is connected to the second power terminal, and a second electrode of the second transistor is connected to the pull-down control node.

5. The shift register unit according to claim 1, wherein the second control sub-circuit comprises: a third transistor and a fourth transistor; wherein
a gate of the third transistor is connected to the pull-down control node, a first electrode of the third transistor is connected to the first power terminal, and a second electrode of the third transistor is connected to the pull-down node; and
a gate of the fourth transistor is connected to the second pull-up node, a first electrode of the fourth transistor is connected to the second power terminal, and a second electrode of the fourth transistor is connected to the pull-down node.

6. The shift register unit according to claim 1, wherein the pull-down sub-circuit comprises: a fifth transistor, a sixth transistor, and a seventh transistor; wherein
gates of the fifth transistor, the sixth transistor, and the seventh transistor are all connected to the pull-down node, first electrodes of the fifth transistor, the sixth transistor, and the seventh transistor are all connected to the second power terminal, a second electrode of the fifth transistor is connected to the first pull-up node, and a second electrode of the sixth transistor and a second electrode of the seventh transistor are both connected to the output terminal.

7. The shift register unit according to claim 1, further comprising a reset circuit; wherein
the reset circuit is connected to a reset signal terminal, the second power terminal, the first pull-up node, and the second pull-up node respectively, and the reset circuit is configured to output the second power signal to the first pull-up node and the second pull-up node respectively in response to a reset signal provided by the reset signal terminal.

8. The shift register unit according to claim 7, wherein the reset circuit comprises: a first reset sub-circuit and a second reset sub-circuit; wherein
the first reset sub-circuit is connected to the reset signal terminal, the second power terminal, and the first pull-up node respectively, and the first reset sub-circuit is configured to output the second power signal to the first pull-up node in response to the reset signal; and
the second reset sub-circuit is connected to the reset signal terminal, the second power terminal, and the second pull-up node respectively, and the second reset sub-circuit is configured to output the second power signal to the second pull-up node in response to the reset signal.

9. The shift register unit according to claim 8, wherein the first reset sub-circuit comprises: a first reset transistor; wherein
a gate of the first reset transistor is connected to the reset signal terminal, a first electrode of the first reset transistor is connected to the second power terminal, and a second electrode of the first reset transistor is connected to the first pull-up node.

10. The shift register unit according to claim 8, wherein the second reset sub-circuit comprises: a second reset transistor; wherein
a gate of the second reset transistor is connected to the reset signal terminal, a first electrode of the second reset transistor is connected to the second power terminal, and a second electrode of the second reset transistor is connected to the second pull-up node.

11. The shift register unit according to claim 8, wherein the second pull-up node comprises: a first sub-pull-up node and a second sub-pull-up node, and the second reset sub-circuit comprises: two second reset transistors; wherein
a gate of each second reset transistor is connected to the reset signal terminal, a first electrode of each second reset transistor is connected to the second power terminal, a second electrode of one of the second reset transistors is connected to the first sub-pull-up node, and a second electrode of the other second reset transistor is connected to the second sub-pull-up node.

12. The shift register unit according to claim 1, wherein the output terminal comprises: a first output terminal and a second output terminal; wherein
the first output terminal is configured to be connected to a gate line, and the second output terminal is configured to be connected to an input signal terminal of a shift register unit at a next stage; and
the output circuit is also connected to the second pull-up node, the output circuit is configured to output the clock signal to the first output terminal in response to the potential of the first pull-up node, and output the clock signal to the second output terminal in response to the potential of the second pull-up node.

13. The shift register unit according to claim 12, wherein the output circuit comprises: a first output sub-circuit and a second output sub-circuit; wherein
the first output sub-circuit is connected to the first pull-up node, the clock signal terminal, and the first output terminal respectively, and the first output sub-circuit is configured to output the clock signal to the first output terminal in response to the potential of the first pull-up node; and
the second output sub-circuit is connected to the second pull-up node, the clock signal terminal, and the second output terminal respectively, and the second output sub-circuit is configured to output the clock signal to the second output terminal in response to the potential of the second pull-up node.

14. The shift register unit according to claim 13, wherein the first output sub-circuit comprises: a first output transistor and a capacitor, and the second output sub-circuit comprises: a second output transistor; wherein
a gate of the first output transistor is connected to the first pull-up node, a first electrode of the first output transistor is connected to the clock signal terminal, and a second electrode of the first output transistor is connected to the first output terminal;
one terminal of the capacitor is connected to the first pull-up node, and the other terminal of the capacitor is connected to the first output terminal; and
a gate of the second output transistor is connected to the second pull-up node, a first electrode of the second output transistor is connected to the clock signal terminal, and a second electrode of the second output transistor is connected to the second output terminal.

15. The shift register unit according to claim 7, wherein the first power terminal comprises: a first sub-power terminal and a second sub-power terminal, the second power terminal comprises: a third sub-power terminal and a fourth sub-power terminal, and the output terminal comprises: a first output terminal and a second output terminal;
the pull-down control circuit comprises: a pull-down control transistor; wherein both a gate and a first electrode of the pull-down control transistor are connected to the input signal terminal, and a second electrode of the pull-down control transistor is connected to the second pull-up node;
the reset circuit comprises: a first reset transistor and a second reset transistor; wherein gates of the first reset transistor and the second reset transistor are both connected to the reset signal terminal, first electrodes of the first reset transistor and the second reset transistor are both connected to the third sub-power terminal, a second electrode of the first reset transistor is connected to the first pull-up node, and a second electrode of the second reset transistor is connected to the second pull-up node;
the output circuit comprises: a first output transistor, a second output transistor, and a capacitor; wherein a gate of the first output transistor is connected to the first pull-up node, a first electrode of the first output transistor is connected to the clock signal terminal, a second electrode of the first output transistor is connected to the first output terminal, a gate of the second output transistor is connected to the second pull-up node, a first electrode of the second output transistor is connected to the clock signal terminal, a second electrode of the second output transistor is connected to the second output terminal, one terminal of the capacitor is connected to the first pull-up node, and the other terminal of the capacitor is connected to the first output terminal;

the input circuit comprises: an input transistor; wherein both a gate and a first electrode of the input transistor are connected to the input signal terminal, and a second electrode of the input transistor is connected to the first pull-up node; and the pull-down circuit comprises: two first transistors, two second transistors, two third transistors, two fourth transistors, two fifth transistors, two sixth transistors, and two seventh transistors; wherein a gate and a first electrode of one first transistor, and a first electrode of one third transistor are connected to the first sub-power terminal, and a gate and a first electrode of the other first transistor and a first electrode of the other third transistor are both connected to the second sub-power terminal; first electrodes of the two second transistors, first electrodes of the two fourth transistors, first electrodes of the two fifth transistors and first electrodes of the two seventh transistors are connected to the third sub-power terminal, and first electrodes of the two sixth transistors are both connected to the fourth sub-power terminal; and second electrodes of the two sixth transistors are both connected to the first output terminal, and second electrodes of the two seventh transistors are both connected to the second output terminal.

16. A method for driving a shift register unit, wherein the shift register unit comprises: an input circuit, an output circuit, a pull-down control circuit, and a pull-down circuit; wherein the input circuit is connected to an input signal terminal and a first pull-up node respectively, the output circuit is connected to the first pull-up node, a clock signal terminal, and an output terminal respectively, the pull-down control circuit is connected to the input signal terminal and a second pull-up node respectively, and the pull-down circuit is connected to a first power terminal, a second power terminal, the first pull-up node, the second pull-up node, and the output terminal respectively; and the method comprises:
at an input stage where a potential of an input signal provided by the input signal terminal is a first potential:
controlling, by the input circuit, a potential of the first pull-up node to be the first potential in response to the input signal,
controlling, by the pull-down control circuit, a potential of the second pull-up node to be the first potential in response to the input signal, and
prohibiting, by the pull-down circuit, an output of the second power signal from the second power terminal to the first pull-up node and the output terminal in response to the potential of the second pull-up node; and
at an output stage where the potential of the first pull-up node is the first potential, outputting, by the output circuit, the clock signal from the clock signal terminal to the output terminal in response to the potential of the first pull-up node,
wherein the pull-down circuit comprises: a first control sub-circuit, a second control sub-circuit, and a pull-down sub-circuit; wherein
the first control sub-circuit is connected to the first power terminal, the second power terminal, the pull-down control node, and the second pull-up node respectively, and the first control sub-circuit is configured to output the first power signal to the pull-down control node in response to the first power signal, and output the second power signal to the pull-down control node in response to the potential of the second pull-up node;
the second control sub-circuit is connected to the first power terminal, the second power terminal, the pull-down control node, the pull-down node, and the second pull-up node respectively, and the second control sub-circuit is configured to output the first power signal to the pull-down node in response to the potential of the pull-down control node, and output the second power signal to the pull-down node in response to the potential of the second pull-up node; and
the pull-down sub-circuit is connected to the pull-down node, the first pull-up node, the output terminal, and the second power terminal respectively, and the pull-down sub-circuit is configured to output the second power signal to the first pull-up node and the output terminal respectively in response to a potential of the pull-down node.

17. The method according to claim 16, wherein the shift register unit comprises: a reset circuit, wherein the reset circuit is connected to a reset signal terminal, the second power terminal, the first pull-up node, and the second pull-up node respectively; and the method further comprises:
at a pull-down stage where a potential of the reset signal provided by the reset signal terminal is the first potential:
outputting, by the reset circuit, a second power signal from the second power terminal to the second pull-up node in response to the reset signal, and
outputting, by the pull-down circuit, the second power signal to the first pull-up node and the output terminal respectively in response to the potential of the second pull-up node and the first power signal provided by the first power terminal,
wherein the potential of the first power signal is the first potential, and the potential of the second power signal is a second potential.

18. A gate drive circuit, comprising: at least two cascaded shift register units, wherein each shift register unit comprises: an input circuit, an output circuit, a pull-down control circuit and a pull-down circuit; wherein the input circuit is connected to an input signal terminal and a first pull-up node respectively, and the input circuit is configured to control a potential of the first pull-up node in response to an input signal provided by the input signal terminal;

the output circuit is connected to the first pull-up node, a clock signal terminal, and an output terminal respectively, and the output circuit is configured to output a clock signal from the clock signal terminal to the output terminal in response to the potential of the first pull-up node;

the pull-down control circuit is connected to the input signal terminal and the second pull-up node respectively, and the pull-down control circuit is configured to control a potential of the second pull-up node in response to the input signal; and the pull-down circuit is connected to a first power terminal, a second power terminal, the first pull-up node, the second pull-up node, and the output terminal respectively, and the pull-down circuit is configured to output a second power signal from the second power terminal to the first pull-up node and the output terminal respectively in response to the potential of the second pull-up node and a first power signal provided by the first power terminal, wherein the pull-down circuit comprises: a first control sub-circuit, a second control sub-circuit, and a pull-down sub-circuit; wherein the first control sub-circuit is connected to the first power terminal, the second power terminal, the pull-down control node, and the second pull-up node respectively, and the first control sub-circuit is configured to output the first power signal to the pull-down control node in response to the first power signal, and output the second power signal to the pull-down control node in response to the potential of the second pull-up node;

the second control sub-circuit is connected to the first power terminal, the second power terminal, the pull-down control node, the pull-down node, and the second pull-up node respectively, and the second control sub-circuit is configured to output the first power signal to the pull-down node in response to the potential of the pull-down control node, and output the second power signal to the pull-down node in response to the potential of the second pull-up node; and the pull-down sub-circuit is connected to the pull-down node, the first pull-up node, the output terminal, and the second power terminal respectively, and the pull-down sub-circuit is configured to output the second power signal to the first pull-up node and the output terminal respectively in response to a potential of the pull-down node.

19. A display device comprising: a plurality of pixel units, and the gate drive circuit as defined in claim 18 connected to the plurality of pixel units.

* * * * *

UNITED STATES PATENT AND TRADEMARK OFFICE
CERTIFICATE OF CORRECTION

PATENT NO. : 11,410,587 B2
APPLICATION NO. : 16/937656
DATED : August 9, 2022
INVENTOR(S) : Guangying Mou et al.

It is certified that error appears in the above-identified patent and that said Letters Patent is hereby corrected as shown below:

On the Title Page

Item (73) should read as follows:
(73) Assignee: HEFEI XINSHENG OPTOELECTRONICS TECHNOLOGY CO., LTD., Hefei (CN); BOE TECHNOLOGY GROUP CO., LTD., Beijing (CN)

Signed and Sealed this
Fourth Day of April, 2023

Katherine Kelly Vidal
*Director of the United States Patent and Trademark Office*